United States Patent
Chen et al.

(10) Patent No.: US 11,714,932 B2
(45) Date of Patent: Aug. 1, 2023

(54) DRILL BIT DESIGN WITH REDUCED 3D COUPLED VIBRATION

(71) Applicant: Halliburton Energy Services, Inc., Houston, TX (US)

(72) Inventors: Shilin Chen, Montgomery, TX (US); Shiwei Qin, Conroe, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 288 days.

(21) Appl. No.: 17/006,562

(22) Filed: Aug. 28, 2020

(65) Prior Publication Data
US 2022/0067234 A1   Mar. 3, 2022

(51) Int. Cl.
*G06F 30/17* (2020.01)
*E21B 10/54* (2006.01)
*E21B 10/62* (2006.01)

(52) U.S. Cl.
CPC .............. *G06F 30/17* (2020.01); *E21B 10/62* (2013.01); *E21B 10/54* (2013.01); *E21B 2200/20* (2020.05)

(58) Field of Classification Search
CPC .......... G06F 30/17; G06F 30/20; G06F 30/10; E21B 10/62; E21B 10/54; E21B 10/42; E21B 2200/20
See application file for complete search history.

(56) References Cited

U.S. PATENT DOCUMENTS

| | | | | |
|---|---|---|---|---|
| 6,349,595 B1 * | 2/2002 | Civolani | ................. | G01N 3/42 73/152.02 |
| 8,401,831 B2 * | 3/2013 | Tang | ................... | E21B 17/1014 703/7 |
| 8,589,136 B2 * | 11/2013 | Ertas | ....................... | E21B 7/00 703/1 |
| 8,798,978 B2 * | 8/2014 | Ertas | ...................... | E21B 44/00 73/152.47 |

(Continued)

FOREIGN PATENT DOCUMENTS

WO    2020139341 A1    7/2020

OTHER PUBLICATIONS

Macpherson, J.D., et al. "Application and Analysis of Simultaneous Near Bit and Surface Dynamics Measurements" Society of Petroleum Engineers, SPE 74718, pp. 230-238 (2001) (Year: 2001).*

(Continued)

*Primary Examiner* — Jay Hann
(74) *Attorney, Agent, or Firm* — DeLizio, Peacock, Lewin & Guerra

(57) ABSTRACT

A drill bit design generator uses drill bit metrics to generate drill bit designs with reduced 3D coupled vibration. The drill bit design generator generates an initial set of drill bit designs that are simulated in a deployed or artificial environment. Simulated drill bits according to the initial drill bit designs have gyroscopic sensors that detect the presence of 3D coupled vibration. A drill bit simulator tracks metrics such as side cutting efficiency and drilling efficiency during (Continued)

simulations and correlates these metrics with 3D coupled vibration. The drill bit design generator determines thresholds for these metrics using correlations with 3D coupled vibration and generates updated/new drill bit designs using the metric thresholds.

18 Claims, 18 Drawing Sheets

(56) References Cited

U.S. PATENT DOCUMENTS

| | | | | |
|---|---|---|---|---|
| 9,022,145 | B2* | 5/2015 | Rodney | E21B 47/007 175/56 |
| 9,482,055 | B2* | 11/2016 | Huang | E21B 10/16 |
| 2006/0162968 | A1* | 7/2006 | Durairajan | E21B 10/54 175/426 |
| 2011/0077924 | A1 | 3/2011 | Ertas et al. | |
| 2014/0374156 | A1* | 12/2014 | Griffo | E21B 10/55 175/17 |
| 2017/0030166 | A1* | 2/2017 | Shen | E21B 41/0085 |
| 2020/0386055 | A1 | 12/2020 | Chen | |
| 2021/0047909 | A1* | 2/2021 | Bailey | E21B 47/00 |
| 2021/0231528 | A1 | 7/2021 | Bowers, III | |
| 2022/0065687 | A1 | 3/2022 | Chen et al. | |
| 2022/0121790 | A1* | 4/2022 | Chen | E21B 47/00 |

OTHER PUBLICATIONS

Baumgartner, et al., "Pure and Coupled Drill String Vibration Pattern Recognition in High Frequency Downhole Data", SPE Annual Technical Conference and Exhibition, Oct. 27-29, 2014, Amsterdam, The Netherlands, 23 pages.

Chen, et al., "Identification and Mitigation of Friction- and Cutting Action-Induced Stick-Slip Vibrations with PDC Bits", Society of Petroleum Engineers, IADC/SPE International Drilling Conference and Exhibition, Mar. 3-5, 2020, Galveston, Texas, USA.

Elliott, et al., "Fully-Coupled Nonlinear 3-D Time-Domain Simulation of Drilling Dysfunctions Using a Multi-Body Dynamics Approach", SPE/IADC Drilling Conference and Exhibition, Mar. 17-19, 2015, London, England, UK, 18 pages.

Hareland, et al., "Cutting Efficiency of a Single PDC Cutter on Hard Rock", Canadian International Petroleum Conference, Jun. 12-14, 2007, Calgary, Alberta, 11 pages.

Sugiura, et al., "Simulation and Measurement of High-Frequency Torsional Oscillation HFTO/High-Frequency Axial Oscillation HFAO and Downhole HFTO Mitigation: Knowledge Gains Continue by Using Embedded High-Frequency Drilling Dynamics Sensors", IADC/SPE International Drilling Conference and Exhibition, Mar. 3-5, 2020, Galveston, Texas, USA, 32 pages.

\* cited by examiner

DRILL BIT DESIGN WITH REDUCED 3D COUPLED VIBRATION

BACKGROUND

The disclosure generally relates to earth or rock drilling and to drilling tools.

Deployed drill bits experience vibrations in the axial, lateral, and torsional directions downhole that generate wear and may damage downhole tools over time. In addition to vibrations along individual directions, such as high frequency torsional oscillation (HFTO) in the torsional direction, vibrations couple across multiple dimensions. 2D coupled vibrations include coupled vibrations of a drillstring including coupled axial-torsional vibrations, coupled axial-lateral vibrations and coupled torsional-lateral vibrations.

BRIEF DESCRIPTION OF THE DRAWINGS

Aspects of the disclosure may be better understood by referencing the accompanying drawings.

DESCRIPTION

The description that follows includes example systems, methods, techniques, and program flows that embody aspects of the disclosure. However, it is understood that this disclosure may be practiced without these specific details. For instance, this disclosure refers to generating drill bit designs with reduced 3D coupled vibration in illustrative examples. Aspects of this disclosure can be also applied to generating drill bit designs to reduce resonance in a borehole assembly due to other factors downhole. In other instances, well-known instruction instances, protocols, structures and techniques have not been shown in detail in order not to obfuscate the description.

Overview

Vibrations occurring in a drill bit at a same frequency across lateral, axial, and torsional directions resonate to cause "3D coupled vibration" which can amplify the net effect of each individual vibration and can cause extensive wear in the drill bit and bottom hole assembly. Drill bit designs typically include parameters such as number of blades, blade orientation, bit size, bit shape, etc. that do not directly account for phenomena such as 3D coupled vibration. Instead, techniques for correlating auxiliary drill bit metrics to 3D coupled vibration are described herein, enabling drill bit designs that reduce 3D coupled vibration using knowledge of how drill bit design parameters impact the auxiliary metrics.

A drill bit design generator generates an initial set of drill bit designs based on anticipated operational conditions. These initial drill bit designs are tested using a drill bit simulator (i.e. in a deployed bottom hole assembly or in a bottom hole assembly digging through artificial rock formations in a lab). During the simulations, gyroscopic sensors measure axial, lateral, and torsional vibrations in the drill bit. Auxiliary metrics for the drill bit including drilling efficiency (DE) and side cutting efficiency (SCE) are computed for the drill bit across a number of trials (e.g., 100), and DE and SCE are correlated to 3D coupled vibration across trials. If a sufficient correlation is determined, a 3D coupled vibration correlation analyzer determines thresholds for each auxiliary metric with a determined correlation. The drill bit design generator uses expert knowledge for drill bit designs to reduce the auxiliary metrics below the thresholds to generate revised drill bit designs with reduced 3D coupled vibration.

Example Illustrations

Figure 1:
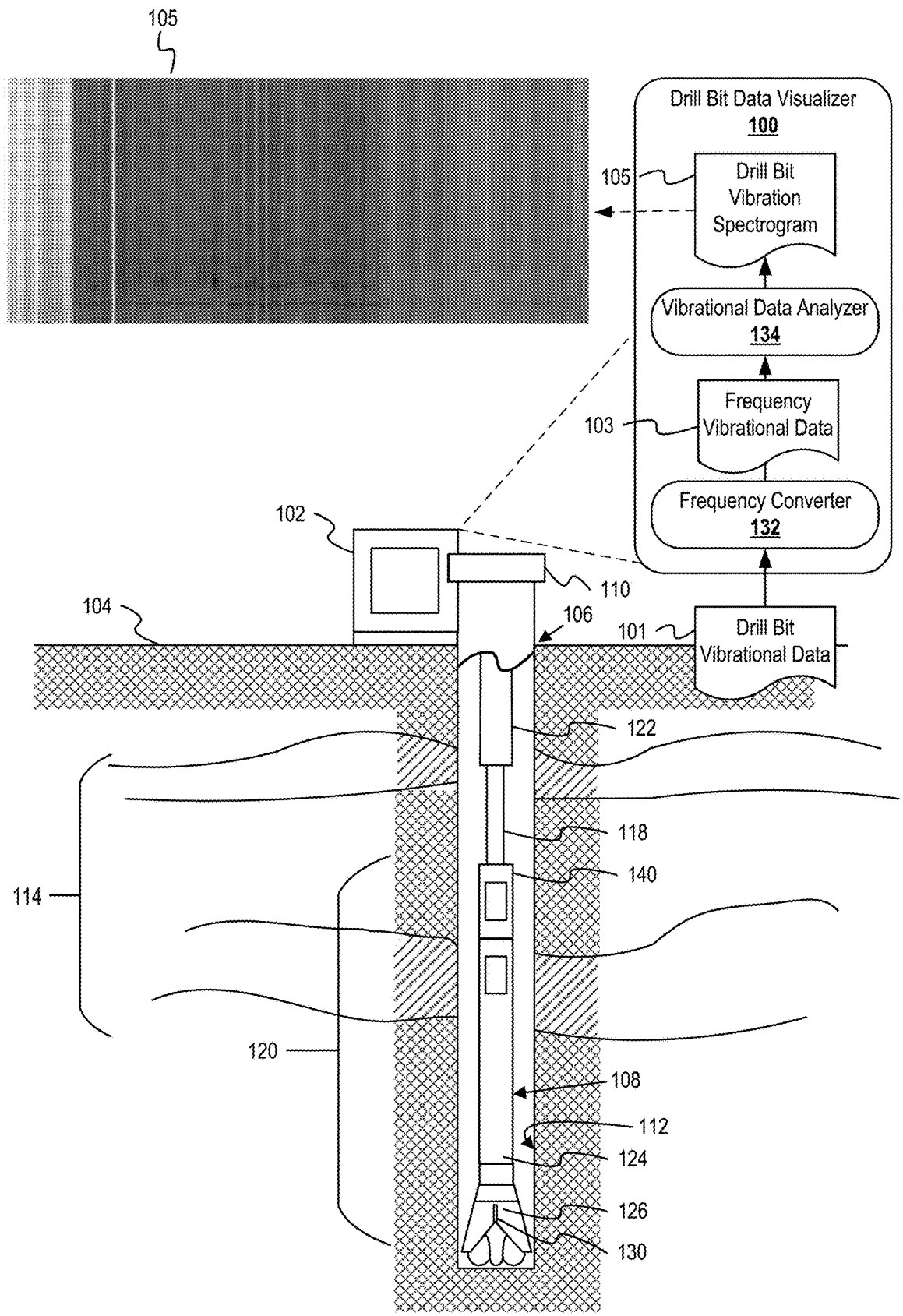
FIG. 1 is a schematic diagram of a drill bit data visualizer for visualizing 3D coupled vibration in a drill bit.

FIG. 1 is a schematic diagram of a drill bit data visualizer for visualizing 3D coupled vibration in a drill bit. Drilling of oil and gas wells is commonly carried out using a string of drill pipes connected together so as to form a drilling string 108 that is lowered through a rotary table 110 into a wellbore or borehole 112 in a well 106. The drill string 108 may operate to pass through the rotary table 110 for drilling the borehole 112 through subsurface formations 114. The drill string 108 may include a drill pipe 118 and a bottom hole assembly 120, perhaps located at the lower portion of the drill pipe 118. The bottom hole assembly 120 includes drill collars 122, a down hole tool 124, and a drill bit 126. The drill bit 126 operates to create a borehole 112 by penetrating a surface 104 and subsurface formations 114. The down hole tool 124 may comprise any of a number of different types of tools including MWD tools, LWD tools, and others.

During drilling operations, the drill string 108 (perhaps including the drill pipe 118 and the bottom hole assembly 120) may be rotated by the rotary table 110. In addition to, or alternatively, the bottom hole assembly 120 may also be rotated by a motor (e.g., a mud motor) that is located down hole. The drill collars 122 may be used to add weight to the drill bit 126. The drill collars 122 may also operate to stiffen the bottom hole assembly 120, allowing the bottom hole assembly 120 to transfer the added weight to the drill bit 126, and in turn, to assist the drill bit 126 in penetrating the surface 104 and subsurface formations 114. A vibrational sensor 130 (e.g., a gyroscope) is embedded in the axial shaft of the drill bit 126 and can detect high frequency vibrational data for the drill bit 126 in the axial, torsional, and lateral directions. Typical frequencies for vibration detection can be between 0 and 400 hertz (Hz). Additional vibrational sensors can be situated throughout the bottom hole assembly 120 to detect vibrations propagating beyond just the drill bit 126. Often in the case of 3D coupled vibration, vibrations occurring in the drill bit 126 can induce vibrations in the entire bottom hole assembly 120 which increases wear on its components and may damage some of them.

A computer 102 situated at the surface 104 collects drill bit vibrational data 101 from the vibrational sensor 130 downhole. The computer 102 can be communicatively coupled to the vibrational sensor 130 via, for instance, a wire running down the drill string 108. Although depicted as at the surface 104, the computer 102 can be running offsite or can be collecting drill bit vibrational data 101 from a simulated drill bit in a lab prior to deployment. The computer 102 comprises a drill bit data visualizer 100 that converts the drill bit vibrational data 101 into frequency data in order to visualize and detect 3D coupled vibration.

A frequency converter 132 running on the drill bit data visualizer 100 receives the drill bit vibrational data 101. The frequency converter 132 converts the drill bit vibrational data 101 into frequency vibration data 103. For instance, the frequency converter 132 can apply a discrete Fourier transform to the drill bit vibrational data 101 for each of the axial, lateral, and vibrational directions. The Fourier transformation can be applied to windows of time or depth or can be applied globally across all values of time or depth. If $\{t_i\}_{i=1}^n$ are time values at which to compute the Fourier transform, and $\{r_i\}_{i=1}^n$ are the corresponding values for rotational speed in revolutions per minute (RPMs), then the j-th coefficient for the torsional frequency spectrum $\omega_{j,T}$ can be computed using the discrete Fourier transform as $$\omega_{j,T} = \sum_{i=1}^{n} r_i e^{-i\frac{2\pi}{n}j(i-1)}.$$

The frequency vibrational data 103 comprises the values of these coefficients across all values of j=1, . . . , n as well as for varying windows for computing the Fourier transform. For the lateral and axial vibrations, the RPM values can be replaced by lateral amplitude and axial amplitude respectively (in g or gravitational force in meters per second squared). Instead of using a discrete Fourier transform, embodiments could use a continuous Fourier transform, various types of wavelet transforms, band pass filters, etc. to determine the frequency vibrational data 103.

A vibrational data analyzer 134 receives the frequency vibrational data 103 comprising frequency spectrums for the lateral, torsional, and axial vibrational data in the drill bit vibrational data 101 over various windows. The vibrational data analyzer 134 analyzes the frequency spectrums (i.e. absolute values of coefficients of the discrete Fourier transform) to determine the top k peaks in frequency spectrum for each of the windows and determines the presence of 3D coupled vibration based on common peaks across the frequency spectrums for each of the torsional, vibrational, and lateral frequency data. The value for k can vary across windows and can be determined based on prior experiments in detecting 3D coupled vibration or known domain knowledge about typical numbers of peaks for the frequency spectrums. The vibrational data analyzer 134 aggregates data for frequency spectrums and 3D coupled vibration to generate visualizations including a drill bit vibration spectrogram 105. The visualizations include spectrograms, plots of frequency spectrums, plots of vibration, plots of 3D coupled vibration on a graph of frequency versus depth, etc. either globally or for aggregated windows. For the drill bit vibration spectrogram 105, the vibrational data analyzer 134 collects data across evenly spaced windows of time or depth (e.g., every 5 seconds) and plots the magnitude of coefficients in the frequency spectrum over each window. The shade of each rectangle in the drill bit vibration spectrogram 105 represents the magnitude of the corresponding coefficient, where the x-axis is time and the y-axis is frequency. Alternatively, the spectrogram can plot the x-axis as frequency and the y-axis as time.

Figure 2:
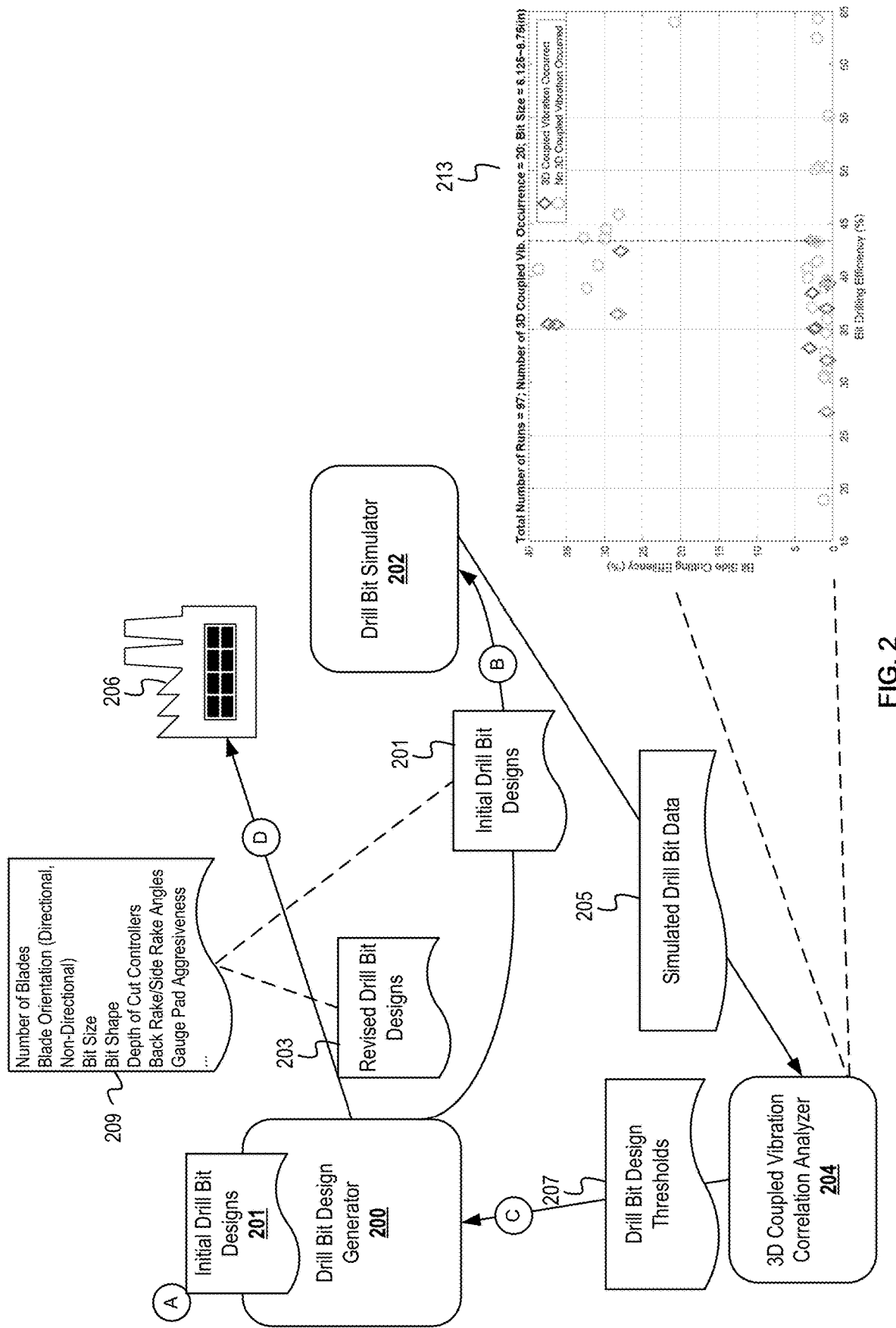
FIG. 2 is a schematic diagram of a drill bit designer for mitigating 3D coupled vibration.

FIG. 2 is a schematic diagram of a drill bit designer for mitigating 3D coupled vibration. FIG. 2 is annotated with a series of letters A-E. These letters represent stages of operations. Although these stages are ordered for this example, the stages illustrate one example to aid in understanding this disclosure and should not be used to limit the claims. Subject matter falling within the scope of the claims can vary with respect to the order and some of the operations.

A drill bit design generator 200 generates initial drill bit designs 201 comprising various drill bit parameters 209 and sends the initial drill bit designs 201 to a drill bit simulator 202. The drill bit simulator 202 determines drilling efficiency (DE) and side cutting efficiency (SCE) over a number of simulations for each bit design in the initial drill bit designs 201. The drill bit simulator then sends simulated drill bit data 205 from the simulations to a 3D coupled vibration correlation analyzer 204. The 3D coupled vibration correlation analyzer 204 determines whether 3D coupled vibration occurs using vibrational data for each of the simulations. The 3D coupled vibration correlation analyzer 204 then correlates DE and SCE to 3D coupled vibration in the drill bit designs and determines DE and SCE thresholds to mitigate 3D coupled vibration if such a correlation exists. The 3D coupled vibration correlation analyzer 204 can further generate a plot 213 of DE versus SCE for 3D coupled and non-3D coupled drill bit designs. The plot 213 can indicate a threshold for at least one of DE and SCE. The thresholds can comprise a value or range of values, and a value can correspond to an upper or lower limit for a metric. The 3D coupled vibration correlation analyzer 204 sends the drill bit design thresholds 207 to the drill bit design generator 200. The drill bit design generator 200 uses the drill bit design thresholds 207 to generate revised drill bit designs 203 which it sends to a drill bit manufacturer 206.

At stage A, the drill bit design generator 200 determines the set of initial drill bit designs 201. Each drill bit design has design parameters 209 which may include number of blades, blade orientation (directional, non-directional), bit size, bit shape, depth of cut controllers, back rake/side rake angles, gauge pad aggressiveness, etc. The initial drill bit designs 201 are determined based on operational parameters of the expected deployment for the drill bits. For instance, for a directional drilling operation, the blade orientation can be more conducive to the drill bit changing directions. Other parameters can depend on the weight on bit (WOB), compressive strength of the expected rock types, and other ambient operational conditions such as temperature and pressure downhole.

At stage B, the drill bit simulator 202 receives the initial drill bit designs 201 from the drill bit design generator 200. The drill bit simulator 202 then runs simulations for each of the designs to determine DE and SCE for that design in addition to collecting vibrational data in the torsional, lateral, and axial directions. The simulations can be conducted using a bottom hole assembly in a lab that drills through artificially created rock formations resembling rock formations at a desired drill bit deployment location. Alternatively, the simulations can be conducted at a real-world rock formation. The drill bits can have gyroscopic sensors and accelerometers installed in their axial shafts that can take high frequency measurements of axial, torsional, and lateral vibrations in the drill bit. During the simulations, the drill bit simulator 202 takes ongoing measurements of rate of penetration (ROP), rock compressive strength, cross-sectional area of the hole drilled by the bit, the torque on bit (TOB), rate of lateral penetration (ROL), and various forces to calculate the total DE and SCE. The DE is computed as $$DE = \frac{\sigma_{rock}}{E_s} 100\%, \text{ where } E_s = \frac{WOB}{A} + \frac{120\pi * RPM * TOB}{A * ROP}, \quad (1)$$

and the SCE is computed as $$SCE = \frac{ROL/F_s}{ROP/WOB} 100\%, \quad (2)$$

where $\sigma_{rock}$ is the compressive strength of the rock in psi, A is the cross sectional area of the hole drilled by the bit, TOB is the torque on bit, and $F_s$ is the bit steer force. $F_s$, WOB, and TOB can all be computed based on the measured values for $\sigma_{rock}$, RPM, ROP, and ROL. The drill bit simulator 202 sends the simulated drill bit data 205 comprising the computed DE and SCE for each simulation as well as the other measurements taken during the simulation to the 3D coupled vibration correlation analyzer 204.

At stage C, the 3D coupled vibration correlation analyzer 204 detects 3D coupled vibration in the simulated drill bit data 205 and determines a correlation between 3D coupled vibration and DE/SCE across simulations. This correlation can be determined, for instance, using mean squared error for a simple linear regression on DE versus the presence of 3D coupled vibration (i.e. a linear regression with the binary response variable that indicates the presence of 3D coupled vibration). If the mean squared error is below a threshold mean squared error, then the correlation can be determined to be present, and the 3D coupled vibration correlation analyzer 204 can determine a threshold value for DE/SCE. The threshold value is typically chosen as the maximal value of DE/SCE for which a simulated drill bit experiences 3D coupled vibration. In some embodiments, outliers can be removed before determining the threshold, and the threshold can be chosen using other methods.

The 3D coupled vibration correlation analyzer 204 can additionally generate a plot 213 of DE versus SCE for drill bit designs where 3D coupled vibration occurred and did not occur. The plot 213 is for a total of 97 drill bit designs for which 20 drill bit designs experienced 3D coupled vibration. The drill bit designs were all chosen to have a bit size between 6.125 and 8.75 inches. Often drill bit designs with similar design considerations (e.g. bit size) are simulated together and the correlation between DE/SCE and 3D coupled vibration is only determined for the set of drill bit designs among the initial drill bit designs 201 with similar design considerations. For example, for plot 213, the 3D coupled vibration correlation analyzer 204 determined that there was a correlation between DE and 3D coupled vibration and the threshold was chosen to be the maximal DE of a drill bit design with 3D coupled vibration at around 43%. 97 runs of PDC bit deployments with non-directional bit design with bit size between 6.124 inches and 8.75 inches were conducted, of which 20 runs experienced 3D coupled vibration. For safety, the threshold DE can be chosen to be 45% to reduce the chance of 3D coupled vibration. Conversely, no correlation between SCE and 3D coupled vibration was found, and no threshold for SCE was generated. The drill bit simulator 202 can track other (auxiliary) drill bit metrics and these auxiliary metrics can be correlated to 3D coupled vibration in addition or alternatively to DE and SCE.

At stage C, the drill bit design generator 200 receives the drill bit design threshold 207 generated by the 3D coupled vibration correlation analyzer 204 and uses it to generate revised drill bit designs 203. The drill bit design generator 200 has prior knowledge about the DE and SCE for certain drill bit designs and can select the drill bit parameters 209 to ensure that the resulting drill bit exceeds desired DE and SCE thresholds upon implementation. In some embodiments, the drill bit design generator 200 can determine that the drill bit design thresholds 207 do not permit a functional drill bit design for the desired implementation. In response, the drill bit design generator 200 can incrementally adjust one or more of the drill bit design thresholds 207 until a drill bit design within the thresholds is possible. Additionally, the drill bit design generator 200 can send the revised drill bit designs 203 to the drill bit simulator 202 to verify the resulting drill bits do not experience 3D coupled vibrations using the operations at stages A and B.

At stage D, the drill bit manufacturer 206 receives the revised drill bit designs 203 from the drill bit design generator 200. The drill bit manufacturer 206 can generate drill bits that include gyroscope sensors and accelerometers in the axial shaft to monitor 3D coupled vibration in deployed drill bits. If the deployed drill bits based on the revised drill bit designs 203 still experience frequent 3D coupled vibration or experience wear after a low number of deployments, the drill bit manufacturer 206 can query the drill bit design generator 200 for more stringent drill bit designs with possibly stricter design thresholds.

The example operations in FIGS. 3-6 are described with reference to a drill bit data visualizer, a drill bit design generator, and a drill bit analyzer for consistency with the earlier figures. The name chosen for the program code is not to be limiting on the claims. Structure and organization of a program can vary due to platform, programmer/architect preferences, programming language, etc. In addition, names of code units (programs, modules, methods, functions, etc.) can vary for the same reasons and can be arbitrary.

Figure 3:
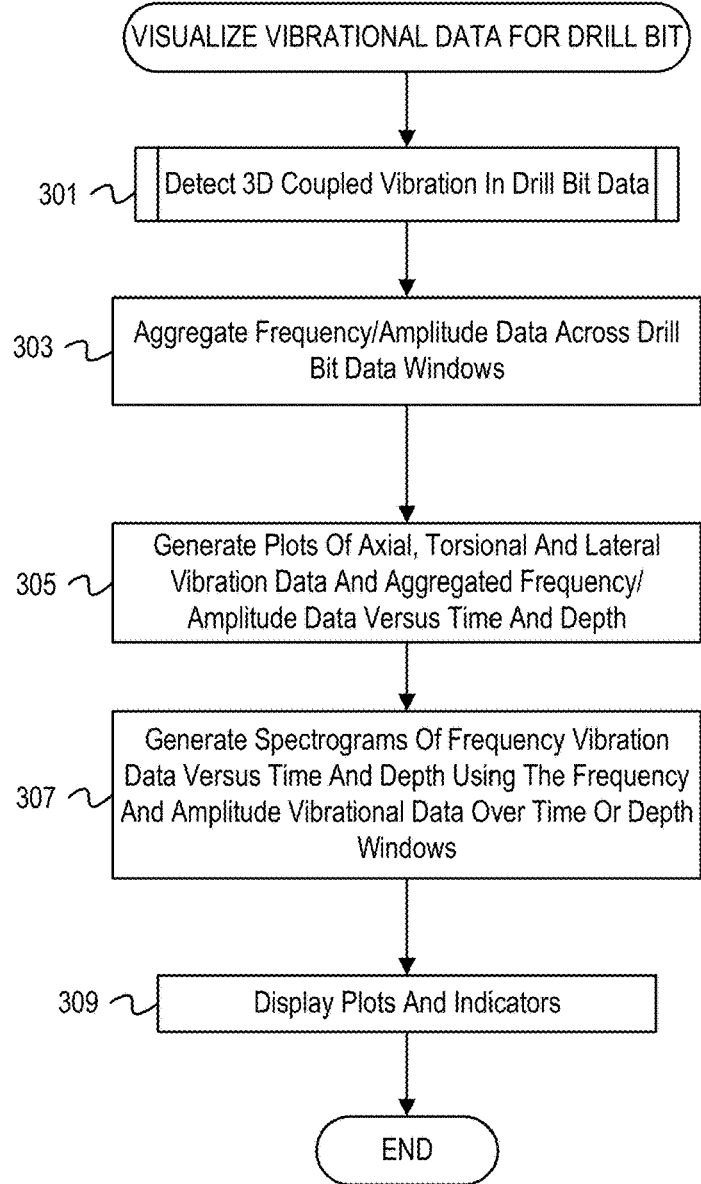
FIG. 3 is a flowchart of example operations for visualizing vibration data for a drill bit.

FIG. 3 is a flowchart of example operations for visualizing vibration data for a drill bit. At block 301, a drill bit data visualizer detects 3D coupled vibration in drill bit data for a drill bit. Detecting 3D coupled vibration involves converting vibrational data for the drill bit into frequency/amplitude vibrational data and analyzing the frequency/amplitude vibrational data to determine common peaks for torsional, lateral, and axial frequencies indicating 3D coupled vibration. These operations are described in greater detail with respect to FIG. 5.

At block 303, the drill bit data visualizer aggregates frequency/amplitude vibrational data across drill bit data windows. The data can be aggregated across evenly spaced windows of time or depth in the case of visualizing a spectrogram. Alternatively, the data can be aggregated globally across all time or depth values or can be aggregated locally in windows around times or depths where 3D coupled vibration is detected at block 301. Aggregating the frequency/amplitude vibrational data can comprise averaging the data over blocks. Alternatively, other statistics such as standard deviation can be computed. Vibrational data for the drill bit can additionally be aggregated for subsequent visualization.

At block 305, the drill bit visualizer generates plots of axial, torsional, and lateral vibration data and aggregated frequency/amplitude vibrational data versus time and depth. The plots can include vibrational data versus time or depth, frequency amplitude versus frequency, and/or heat maps of locations of 3D coupled vibration for the corresponding windows of frequency, time, depth, etc. for each of the axial, lateral, and torsional directions. The plots can include statistics related to any of the aforementioned data sets and can be for any of the windows aggregated at block 303.

At block 307, the drill bit visualizer generates spectrograms of frequency vibration data versus time and depth using the frequency and amplitude vibrational data over time or depth windows. Each spectrogram covers a set of windows in time or depth and comprises a heat map of amplitude for an x-axis of time or depth and a y-axis of frequency. A darker color in the heat map corresponds to a greater amplitude. Spectrograms can be generated independently for each of the torsional, lateral, and axial directions or can be generated across more than one direction by averaging amplitudes.

At block 309, the drilling bit visualizer displays the plots and indicators generated at blocks 305, and 307. The plots can comprise a legend and axis labels. The plots can additionally comprise visual indicators of the presence of 3D coupled vibration such as dotted lines, arrows, markers, etc. Statistical information about the drill bit data that is relevant to 3D coupled vibration, such as bit rotational speed at a peak frequency, can be displayed.

Figure 4:
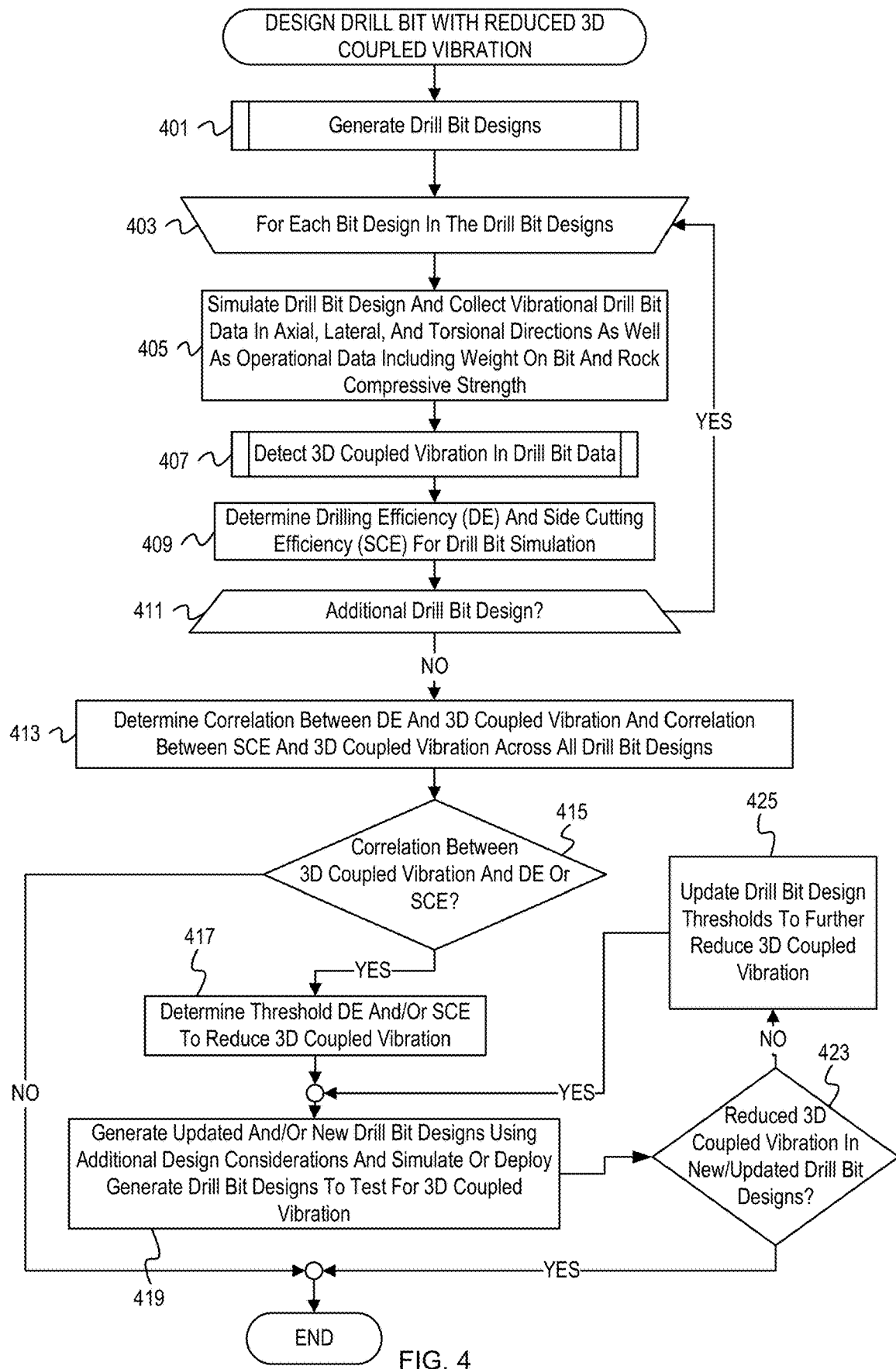
FIG. 4 is a flowchart of example operations for designing a drill bit with reduced 3D coupled vibration.

FIG. 4 is a flowchart of example operations for designing a drill bit with reduced 3D coupled vibration. At block 401, a drill bit design generator determines a set of design thresholds for various design parameters and iteratively generates bit designs. If there are insufficient bit designs within the set of design thresholds, the drill bit design generator relaxes the thresholds. The operations for bit design with reduced 3D coupled vibration are described in greater detail with respect to FIG. 6.

At block 403, the drill bit design generator begins iterating through the drill bit designs generated at block 401. The iterations comprise the example operations at blocks 405, 407, and 409.

At block 405, the drill bit design generator simulates the drill bit design of the current iteration and collects vibrational drill bit data in the axial, lateral, and torsional directions. The drill bit design generator collects operational data from simulating the drill bit design to compute an efficiency metric for the drilling operation. Examples of the operational data include rate of penetration (ROP), rock compressive strength, cross-sectional area of the hole drilled by the bit, and torque on bit (TOB). The simulation can occur in a lab using a synthetic rock formation and a testing bottom hole assembly. Embodiments can use operational data from a real-world drilling operation for simulating a design. Embodiments can deploy a drill bit representative of multiple designs in a real-world drilling operation and collect the operational data from sensors in the representative drill bit for simulations of the represented drill bit designs. Numerical simulations of PDC bit-rock interaction can be performed under specific drilling conditions for RPM, ROP, ROL, rock compressive strength, etc. Forces on each cutting element and non-cutting element, as well as WOB, TOB, DE and SCE can be calculated by the simulator.

At block 407, the drill bit design generator detects 3D coupled vibration in the drill bit data simulated at block 405. Detecting 3D coupled vibration involves generating frequency vibrational data from the drill bit vibrational data simulated at block 405 then detecting common peak frequencies in the frequency vibrational data across the torsional, lateral, and axial directions. The operations for detecting 3D coupled vibration in drill bit data are described in further detail with respect to FIG. 5.

At block 409, the drill bit design generator determines drilling efficiency (DE) and side cutting efficiency (SCE) for the drill bit simulation at block 405. DE and SCE can be determined using the measurements for ROP, rock compressive strength, cross-sectional area of the hole drilled by the bit, and TOB taken at block 405 according to equations (1) and (2). Other efficiency or drilling metrics can be computed, and wear on the bit before and after the simulation can be tracked to gauge the wear effects of drill bit designs both with and without the presence of 3D coupled vibration.

At block 411, the drill bit design generator determines whether there is an additional drill bit design. If an additional drill bit design exists, operations return to block 403. Otherwise, operations continue to block 413.

At block 413, the drill bit design generator determines a correlation between DE and 3D coupled vibration and a correlation between SCE and 3D coupled vibration for all the bit designs iterated at blocks 403, 405, 407, 409, and 411. Each correlation can be determined using a mean squared error for a regression model with the presence of 3D coupled vibration as a binary response variable as described above. More complex correlation techniques, including regression models with multiple design metrics beyond DE and SCE can be used.

At block 415, the drill bit design generator checks whether a correlation between DE and 3D coupled vibration or between SCE and 3D coupled vibration was determined at block 413. If such a correlation was determined for either DE or SCE, operations continue to block 417. Otherwise, operations in FIG. 4 terminate.

At block 417, the drill bit design generator determines a threshold DE and/or SCE to reduce 3D coupled vibration using the determined correlation(s). For each correlation, a threshold DE or SCE is determined over which 3D coupled vibration rarely occurs. The threshold can be determined as the maximal DE or SCE for which 3D coupled vibration is detected during simulations. Alternatively, an additional buffer can be added to the maximal DE or SCE to further reduce the chance of 3D coupled vibration. Alternative methods for determining the threshold, including prior outlier removal upper threshold values, and ranges of threshold values can be used.

At block 419, the drill bit design generator generates updated and/or new drill bit designs using additional design considerations based on the thresholds determined at block 417. The updated drill bit designs can be updated based on the original drill bit designs and the new drill bit designs can be generated from scratch using the thresholds for drill bit design parameters and simulated drill bit data. Any combination of new and updated drill bit designs can be implemented. These updated and/or new drill bit designs are simulated or deployed to test for 3D coupled vibration. Drill bits designs can be simulated using operational data from a real-world deployment. Additionally or alternatively, representative drill bits can be deployed to collect sensor data to evaluate multiple drill bit designs associated with the representative drill bit. Existing drill bit designs that are far outside of thresholds for drill bit design parameters can be removed and replaced with new bit designs. In some embodiments, updated drill bit designs within the threshold DE or SCE will not be possible such that they still maintain drill bit functionality during drilling operations. The thresholds can thus be relaxed so that updated drill designs can be generated.

At block 423, the drill bit design generator determines whether there is reduced 3D coupled vibration in the new/updated drill bit designs simulated or deployed at block 419. This determination can be based on detection of 3D coupled vibration in the simulated/deployed drill bit data as described with reference to block 407. If there is reduced 3D coupled vibration in the updated drill bit designs at a desired level of reduction (e.g., 10% of tested drill bit designs), operations in FIG. 4 terminate. Otherwise, operations continue to block 425.

At block 425, the drill bit design generator updates the drill bit design thresholds to further reduce 3D coupled vibration. For instance, the DE and/or SCE thresholds can be increased by an incremental amount to reduce the chance of 3D coupled vibration. In some embodiments, updating the drill bit thresholds while still enabling a feasible drill bit design for deployment is not possible. In these embodiments, operations at FIG. 4 terminate.

Figure 5:
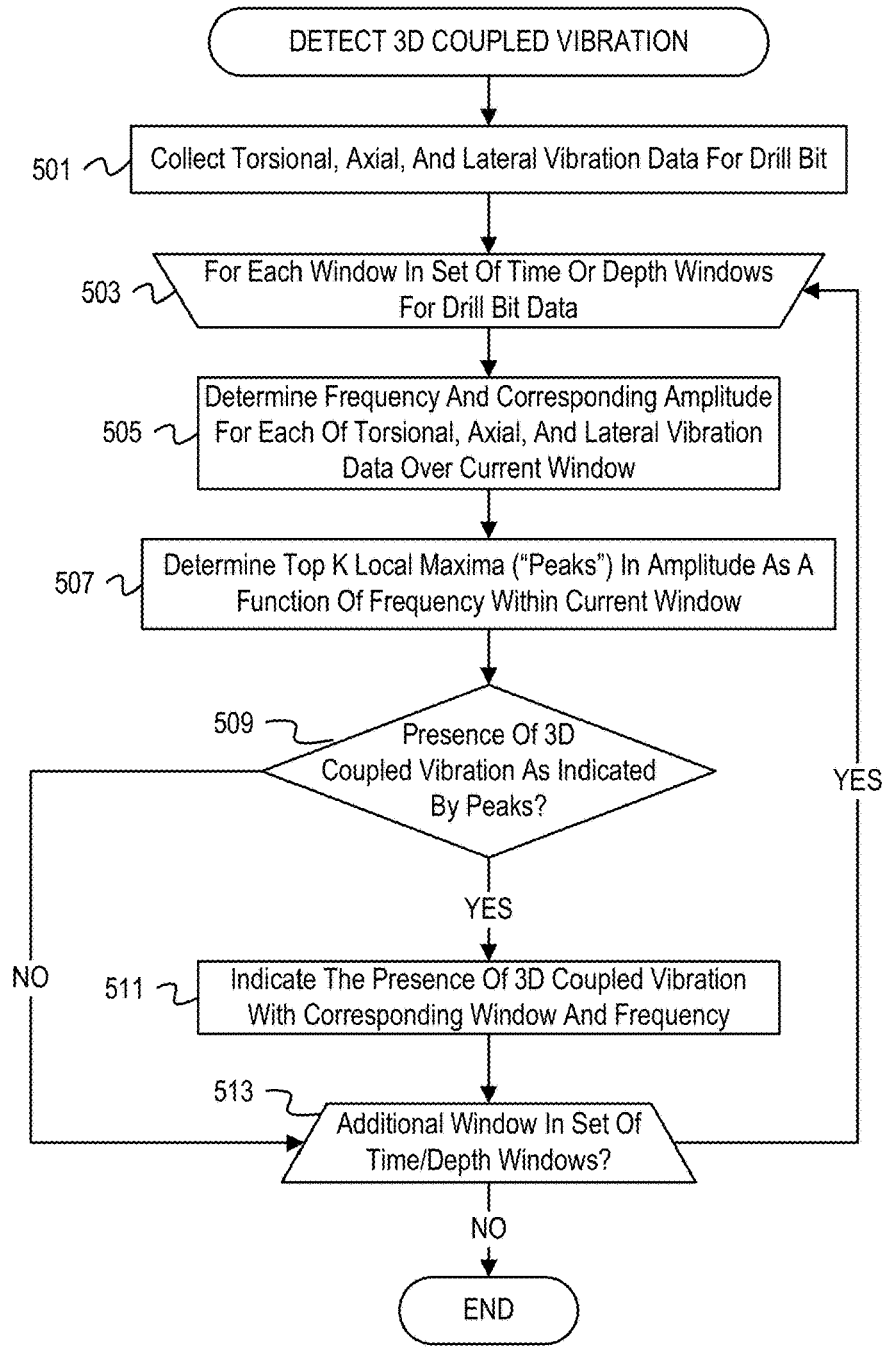
FIG. 5 is a flowchart of example operations for detecting 3D coupled vibration for a drill bit.

FIG. 5 is a flowchart of example operations for detecting 3D coupled vibration for a drill bit. At block 501, a drill bit analyzer collects torsional, axial, and lateral vibration data for a drill bit. The drill bit analyzer can collect the data during simulations or deployment of the drill bit on a bottom hole assembly for a rock formation. The drill bit has an embedded accelerometer that can measure high-frequency vibrational data in each of the aforementioned directions.

At block 503, the drill bit analyzer begins iterating over windows in a set of time or depth windows for drill bit data. The windows can be predetermined based on a desired granularity of analysis, desired visualizations for the vibration data, etc. When only the detection of the presence of 3D coupled vibration is required, a single global window over time or depth can be used. The iterations comprise the operations at blocks 505, 507, 509, and 511.

At block 505, the drill bit analyzer determines a frequency and corresponding amplitude for each of torsional, axial, and lateral vibration data over the window at the current iteration. The drill bit analyzer can average and/or otherwise aggregate the vibration data for the current window for each direction. Subsequently, the drill bit analyzer can take a frequency transformation such as a discrete or continuous Fourier/Wavelet transform, a set of band pass filters, etc. The drill bit analyzer can take absolute values of any complex valued spectrums resulting from these transformations.

At block 507, the drill bit analyzer determines a set of the top K local maxima ("peaks") in amplitude as a function of frequency within the current window for each of the lateral, axial, and torsional frequency/amplitude vibration data. The local maxima are defined as amplitudes that have a higher value than every amplitude within a sufficiently large neighborhood. The size of these neighborhoods and the value for K can depend on typical frequency statistics for spectra of drill bit vibration data (e.g., a common number of peaks in the vibration data for specific drill bit designs). Ranking the peaks can be determined by the prominence of each peak or a different metric (e.g., a value of the discrete second derivative at each peak). Additionally, a minimum prominence requirement can be imposed to qualify as a peak so that there may be less than K peaks.

At block 509, the drill bit analyzer determines whether there is 3D coupled vibration indicated in the top K peaks determined at block 507. 3D coupled vibration is determined by the three following conditions occurring simultaneously:
(i-) a peak occurs at a frequency higher than 5 Hz simultaneously for axial, lateral, and torsional vibration
(ii-) there is significant variation in RPM of the drill bit (in the torsional direction) determined by the equation $$\frac{\max(\text{RPM}) - \text{mean}(\text{RPM})}{\text{mean}(\text{RPM})} > 1$$

where the maximum and mean RPM are determined over the current window (i.e. the RPM exceeds a significant variation threshold) and
(iii-) the RPM at the dominant frequency is greater than 40 RPM (i.e. the RPM at the dominant frequency exceeds a minimum RPM threshold).
The latter 2 conditions are present in high-frequency torsional oscillation (HFTO). Therefore, 3D coupled vibration includes HFTO which is usually associated with a torsional resonance. 3D coupled vibration may be associated either with an axial harmonics resonance and/or with a torsional resonance. As a result, 3D coupled vibration is more harmful than HFTO, which amplifies each of the individual vibrations. The values 5 Hz and 40 RPM and the equation for determining significant variation are examples and any thresholds or functions can vary. If the drill bit analyzer determines the presence of 3D coupled vibration, operations continue to block 511. Otherwise, operations skip to block 513.

At block 511, the drill bit analyzer indicates the presence of 3D coupled vibration with corresponding window of depth/time and frequency. In some embodiments, the 3D coupled vibration can occur at multiple higher resonant frequencies that are multiples of a base resonant frequency. The indicator can alternatively only include a binary indicator that 3D coupled vibration occurred.

At block 513, the drill bit analyzer checks for an additional window in the set of time/depth windows. If there is an additional window, operations return to block 503. Otherwise, operations in FIG. 5 terminate.

Figure 6:
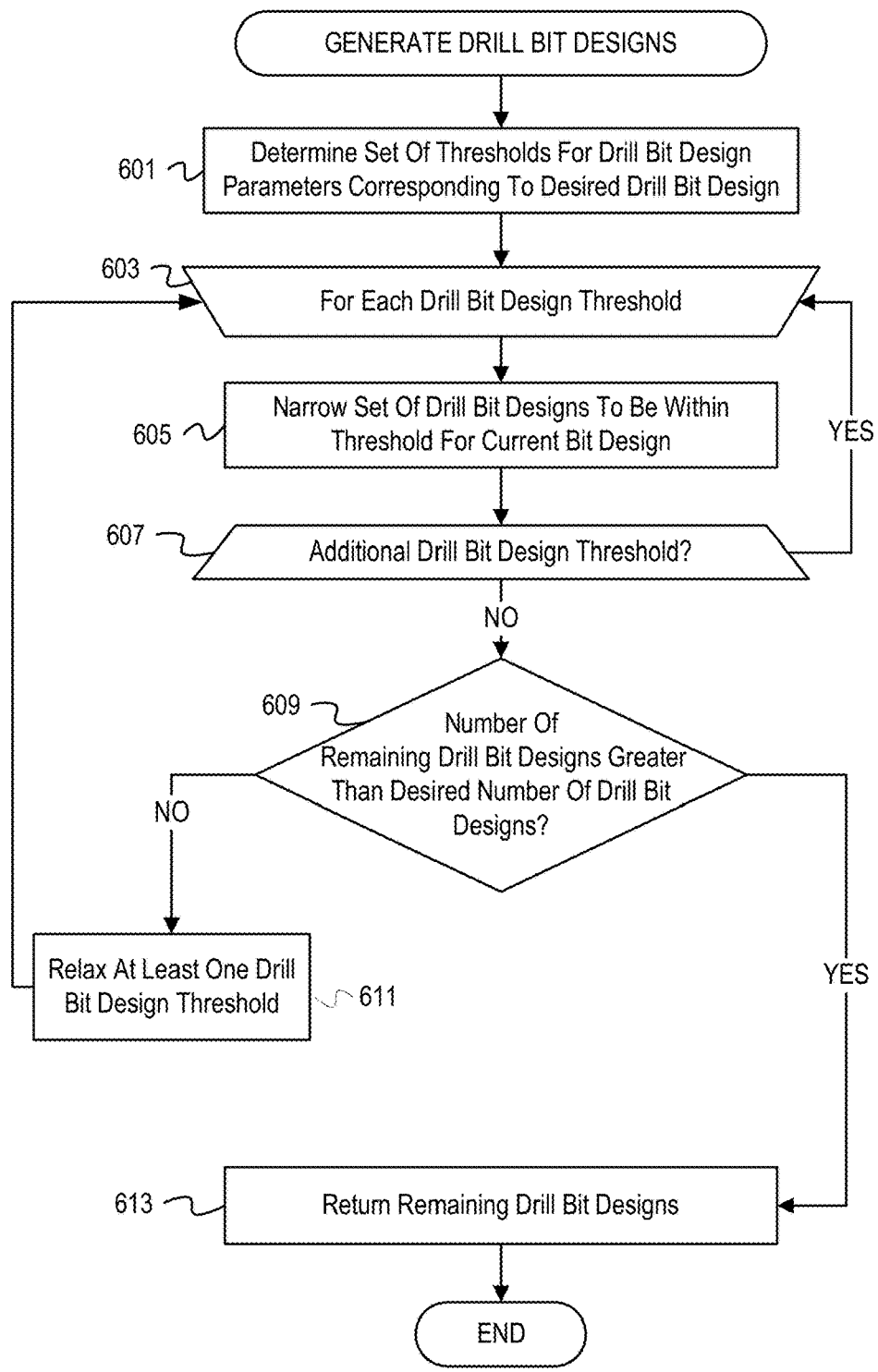
FIG. 6 is a flowchart of example operations for generating drill bit designs.

FIG. 6 is a flowchart of example operations for generating drill bit designs. At block 601, a drill bit design generator determines a set of thresholds for drill bit design parameters corresponding to a desired drill bit design. There can be a wide array of possible drill bit design parameters including number of blades, blade orientation, bit size, bit shape, depth of cut controllers, back rake/side rake angles, gauge pad aggressiveness, etc. that can depend on operational design considerations such as whether a drilling system is directional, weight-on-bit, torque-on-bit, rate of penetration etc.

At block 603, the drill bit design generator begins iterating over each drill bit design threshold in the set of drill bit design thresholds determined at block 601. Operations at each iteration include block 605.

At block 605, the drill bit design generator narrows the set of total feasible drill bit designs based on the drill bit design threshold at the current iteration. The drill bit design threshold can correspond to threshold values for certain drill bit design parameters or can correspond to thresholds for a function of drill bit design parameters. For instance, for DE or SCE, the drill bit designs are constrained by a function that ensures the drill bit design will have sufficiently high DE or SCE. The drill bit parameters can be measured by a function of all or a subset of the parameters and an upper or lower threshold to these parameters can be imposed to improve DE, SCE, or an auxiliary metric of drill bit performance. The drill bit design generate can discard feasible drill bit designs by computing one or more functions of the drill bit parameters and discarding designs with function values above or below a threshold function value. The number of remaining bit designs can be reduced to zero at block 605, and in response, operations can skip to block 611. Otherwise, operations continue to block 607.

At block 607, the drill bit design generator determines if there is an additional drill bit design threshold. If an additional drill bit design threshold exists, operations return to block 603. Otherwise, operations continue to block 609.

At block 609, the drill bit design generator determines whether the number of remaining drill bit designs is greater than a desired number of drill bit designs. The desired number of drill bit designs can be a minimum number of drill bit designs to simulate to ensure conditions are met that were enforced by the drill bit design thresholds e.g., that there is a reduced frequency of 3D coupled vibration. If there is a sufficiently high number of drill bit designs, operations skip to block 613. Otherwise, operations continue to block 611.

At block 611, the drill bit design generator relaxes at least one of the drill bit design thresholds. When a drill bit design threshold is a threshold for one or more drill bit design parameters, the drill bit design generator can increase or decrease the drill bit design thresholds based on whether they are upper or lower thresholds. Alternatively, when the drill bit design threshold is a functions of multiple drill bit design parameters, the drill bit design generator can determine an upper or lower threshold for the function. Operations return to block 603.

At block 613, the drill bit design generator returns the remaining drill bit designs. The drill bit design generator can additionally return the drill bit design thresholds and an indication of whether the drill bit design thresholds were relaxed during the operations of FIG. 6.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 407 and 409 can be performed in parallel or concurrently. With respect to FIG. 5, multiple windows of time and/or depth are not necessary. It will be understood that each block of the flowchart illustrations and/or block diagrams, and combinations of blocks in the flowchart illustrations and/or block diagrams, can be implemented by program code. The program code may be provided to a processor of a general-purpose computer, special purpose computer, or other programmable machine or apparatus.

Figure 7:
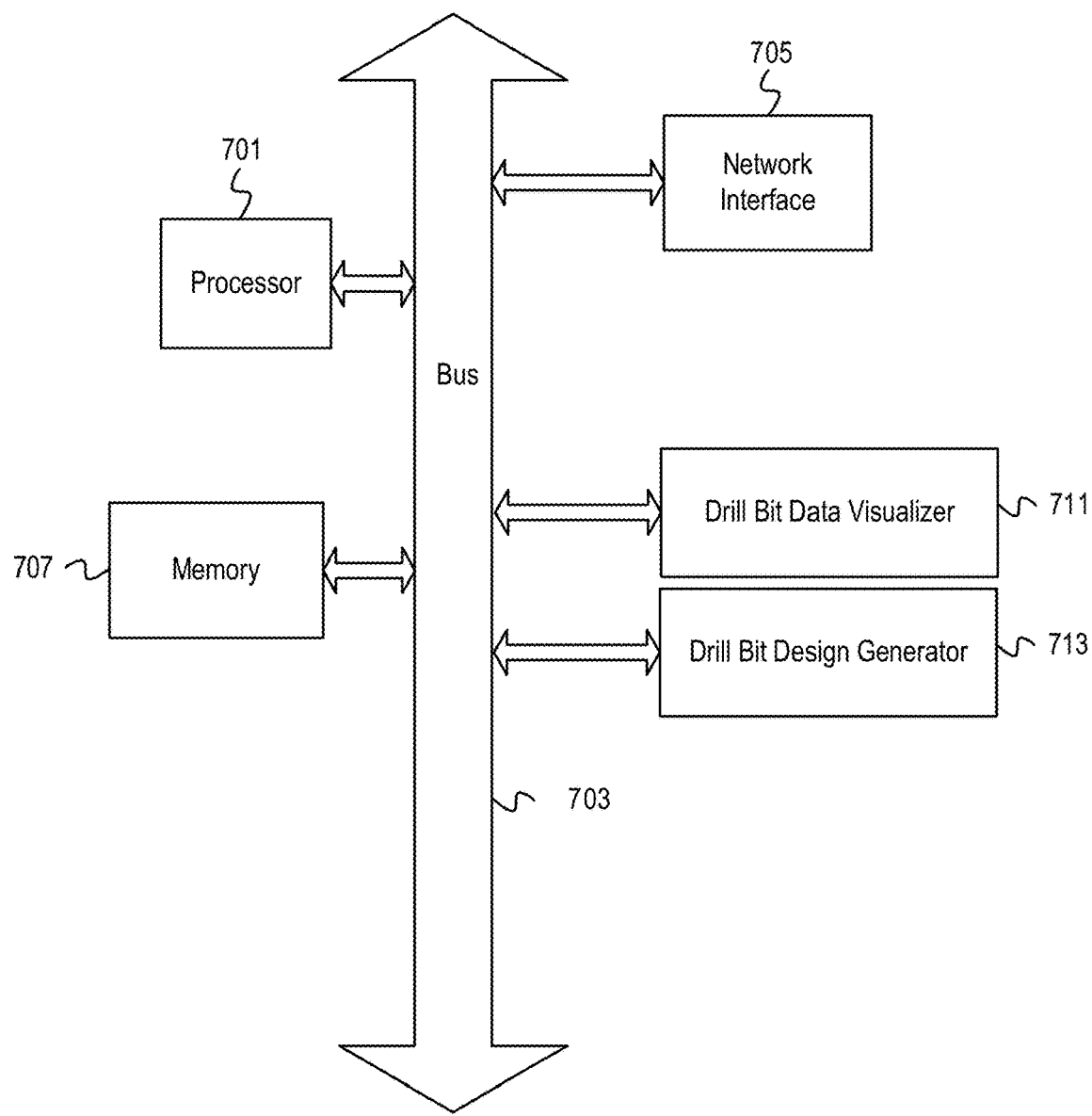
FIG. 7 depicts an example computer system with drill bit data visualizer and a drill bit design generator.

FIG. 7 depicts an example computer system with a drill bit data visualizer and a drill bit design generator. The computer system includes a processor 701 (possibly including multiple processors, multiple cores, multiple nodes, and/or implementing multi-threading, etc.). The computer system includes memory 707. The memory 707 may be system memory or any one or more of the above already described possible realizations of machine-readable media. The computer system also includes a bus 703 and a network interface 705. The system also includes a drill bit data visualizer 711 and a drill bit design generator 713. The drill bit data visualizer 711 can convert lateral, axial, and torsional vibration data for a drill bit into frequency vibration data, can detect 3D coupled vibration in the frequency vibration data, and can generate visualization and indications of the vibration data, frequency vibration data, and presence of 3D coupled vibration. The drill bit design generator 713 can determine drill bit designs within operational thresholds, can test the drill bit designs for 3D coupled vibration as well as drilling efficiency (DE) and side cutting efficiency (SCE), can determine correlations between DE and/or SCE and 3D coupled vibration, and can update the drill bit design based on the determined correlation between DE and/or SCE and 3D coupled vibration. Any one of the previously described functionalities may be partially (or entirely) implemented in hardware and/or on the processor 701. For example, the functionality may be implemented with an application specific integrated circuit, in logic implemented in the processor 701, in a co-processor on a peripheral device or card, etc. Further, realizations may include fewer or additional components not illustrated in FIG. 7 (e.g., video cards, audio cards, additional network interfaces, peripheral devices, etc.). The processor unit 701 and the network interface 705 are coupled to the bus 703. Although illustrated as being coupled to the bus 703, the memory 707 may be coupled to the processor 701.

Figure 8:
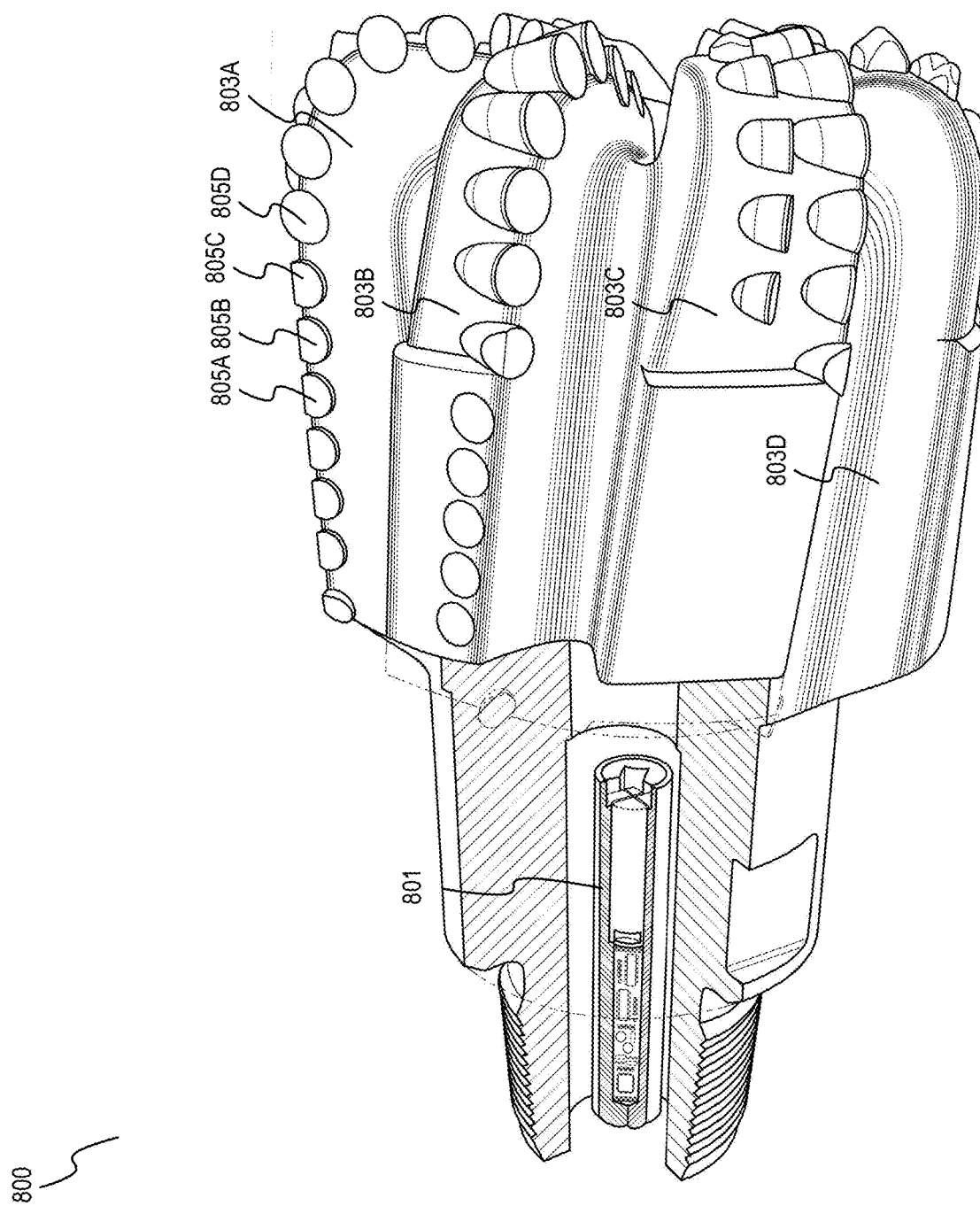
FIG. 8 is a diagram of a polycrystalline diamond compact (PDC) bit having an embedded accelerometer.

FIG. 8 is a diagram of a PDC bit having an embedded accelerometer. A PDC bit 800 comprises cutting blades 803A, 803B, 803C, and 803D, each cutting blade comprising cutters such as cutters 805A, 805B, 805C, 805D, etc. that are embedded on cutting blade 803A. The PDC bit 800 further comprises an accelerometer 801 embedded in an axial shaft. The accelerometer 801 can comprise any sensor configured to measure vibrations of the PDC bit 800 in the axial, lateral, and torsional directions downhole (e.g., a gyroscope). The PDC bit 800 can vary with respect to the number of cutters, number of cutting blades, and any design parameters including blade orientation, bit size, bit shape, etc. The PDC bit 800 is configured to make high frequency vibrational measurements during simulation or deployment.

Figure 9:
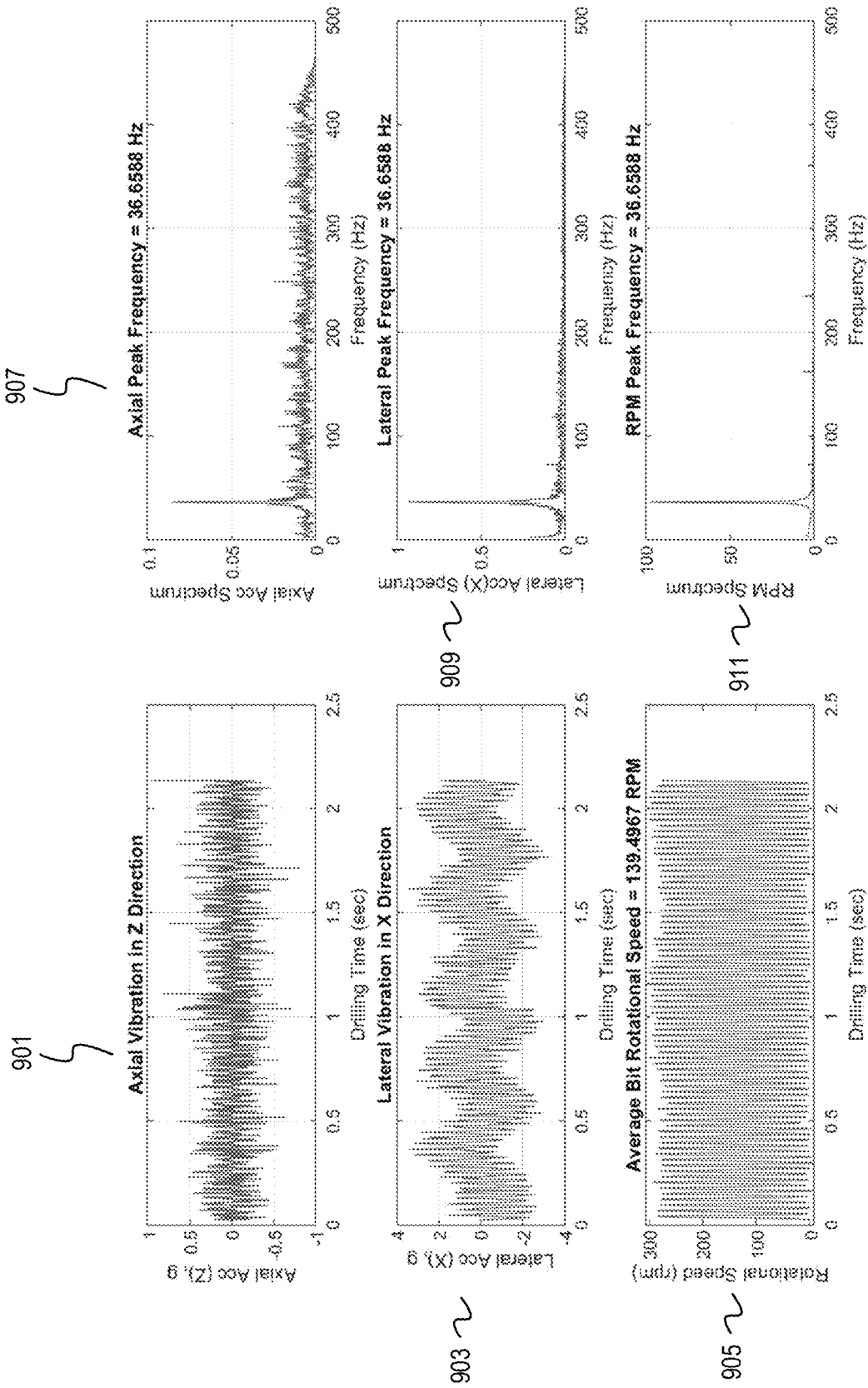
FIG. 9 depicts plots of vibrational data and vibrational frequency data for a PDC drill bit experiencing 3D coupled vibration.

FIG. 9 depicts plots of vibrational data and vibrational frequency data for a PDC drill bit experiencing 3D coupled vibration. A plot 901 displays axial vibration in a z direction in g (acceleration due to gravity) versus drilling time in seconds. A plot 903 displays lateral vibration in an x direction in g versus drilling time in seconds. A plot 905 displays bit rotational speed in RPM versus drilling time in seconds. The overall average bit rotational speed is 139.4967 RPM. Plots 907, 909, and 911 display frequency in Hz versus an axial, lateral, and torsional frequency spectrum, respectively. In each plot, the only peak frequency is at 36.6588 Hz. At this frequency, the axial and lateral vibration amplitudes are 0.08 g and 0.9 g respectively, and the bit rotational speed is 95 RPM. There is a common peak frequency that is greater than 5 Hz, significant variation in RPM, and bit rotational speed above 40 RPM at the peak frequency. These three factors combined indicate the presence of 3D coupled vibration.

Figure 10:
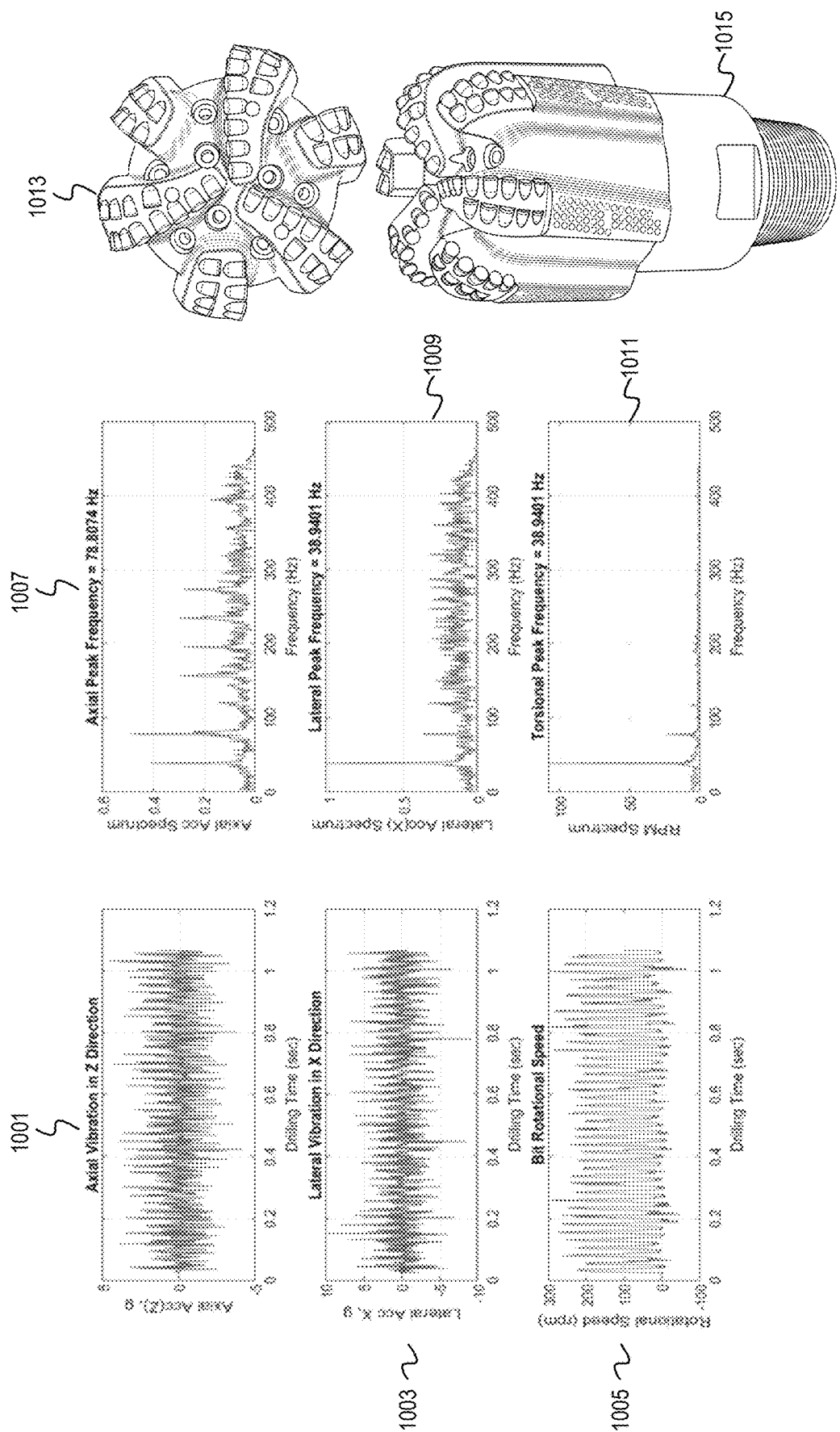
FIG. 10 depicts plots of vibrational data and vibrational frequency data for a 9⅞", 6 blade PDC drill bit experiencing 3D coupled vibration.

FIG. 10 depicts plots of vibrational data and vibrational frequency data for a 9⅞", 6 blade PDC drill bit experiencing 3D coupled vibration. Plots 1001, 1003, and 1005 display axial, lateral, and torsional vibration in g, g, and RPM respectively versus time in seconds. Plots 1007, 1009, and 1001 display plots of lateral, torsional, and frequency spectrum, respectively, versus frequency in Hz. All plots are for the PDC drill bit depicted with top view 1013 and side view 1015 having bit size 9⅞" with 6 blades that is a non-directional PDC drill bit deployed in a vertical well. A primary frequency for 3D coupled vibration occurs at $\omega_1=38.94$ Hz. A second harmonics response occurs in all three vibrations at double the primary frequency, $\omega_2=77.88$ Hz. Excitation of higher axial harmonics occurs in the BHA at frequencies of 120.5 Hz, 156.7 Hz, 195.6 Hz, 234.6 Hz, and 273.5 Hz.

Figure 11:
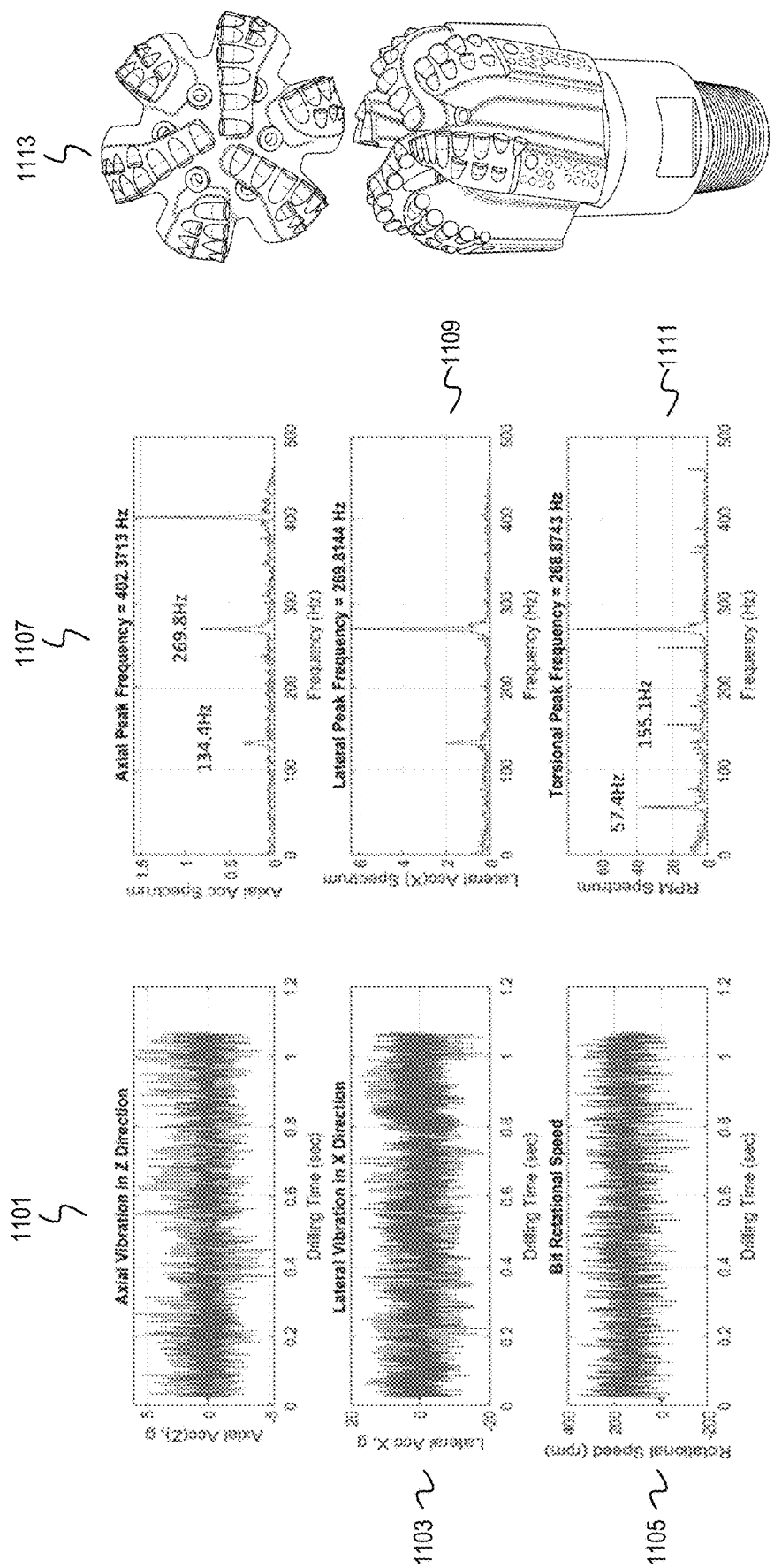
FIG. 11 depicts plots of vibrational data and vibrational frequency data for an 8½", 6 blade PDC drill bit experiencing 3D coupled vibration.

FIG. 11 depicts plots of vibrational data and vibrational frequency data for an 8½", 6 blade PDC drill bit experiencing 3D coupled vibration. Plots 1101, 1103, and 1105 display axial, lateral, and torsional vibration in g, g, and RPM respectively versus time in seconds. Plots 1107, 1109, and 1111 display plots of lateral, torsional, and frequency spectrum respectively versus frequency in Hz. All plots are for the PDC drill bit depicted with top view 1113 and side view 1115 having bit size 8½" with 6 blades deployed in a directional well by a push-the-bit rotary steerable system tool. The coupled frequency for 3D coupled vibration occurs at 269.8 Hz. A primary frequency of 134.4 Hz occurred in the axial and lateral vibrations, but not in torsional vibration. Lower order torsional peak frequencies occur at 57.4 Hz and 155.1 Hz, and a higher torsional peak frequency occurs at 302.37 Hz. Higher order axial harmonics can be correlated with non-directional bits, as seen in the following table which demonstrates a higher relative rate of axial harmonics specifically for PDC bits exhibiting 3D coupled vibration:

| Design Features | Non-Directional Bits | | Directional Bits | Total Runs |
|---|---|---|---|---|
| | With Full Gauge | Without Full Gauge | | |
| Number of Bit Runs | 71 | 91 | 84 | 246 |
| % Having 3D Coupled Vibration | 20(28%) | 15(16%) | 12(14%) | 47(19%) |
| Relative % Having Axial Harmonics | 19(95%) | 12(80%) | 8(67%) | 39(83%) |

Figure 12:
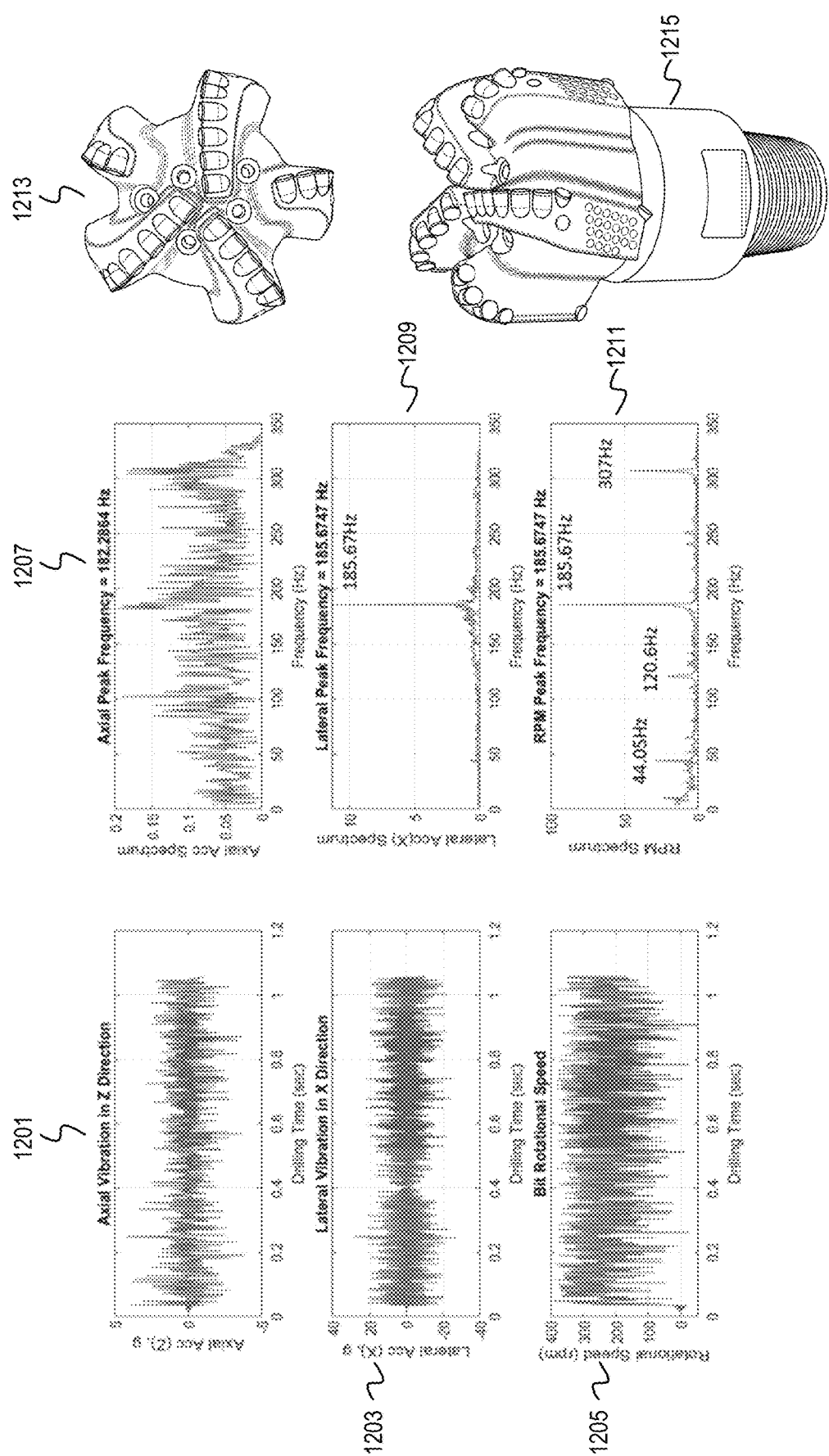
FIG. 12 depicts plots of vibrational data and vibrational frequency data for a 8½", 5 blade PDC drill bit experiencing 3D coupled vibration.

FIG. 12 depicts plots of vibrational data and vibrational frequency data for an 8½", 5 blade PDC drill bit experiencing 3D coupled vibration. Plots 1201, 1203, and 1205 display axial, lateral, and torsional vibration in g, g, and RPM respectively versus time in seconds. Plots 1207, 1209, and 1201 display plots of lateral, torsional, and frequency spectrum respectively versus frequency in Hz. All plots are for the PDC drill bit depicted with top view 1213 and side view 1215 having bit size 8½" with 5 blades in directional drilling with a motor. Lateral and torsional vibrations are dominated by the frequency 185.67 Hz. The lateral vibration amplitude at this frequency is around 11 g and the bit rotational speed is 90 RPM. The axial vibrations do not exhibit harmonics, but the frequency spectrum is distributed with three peaks near 102 Hz, 182 Hz, and 307 Hz. Torsional vibrations occur with peaks at 44.05 Hz, 120.6 Hz, 185.67 Hz, and 207 Hz. The peak in the axial frequency spectrum around 182 Hz is enough to induce 3D coupled vibration.

Figure 13:
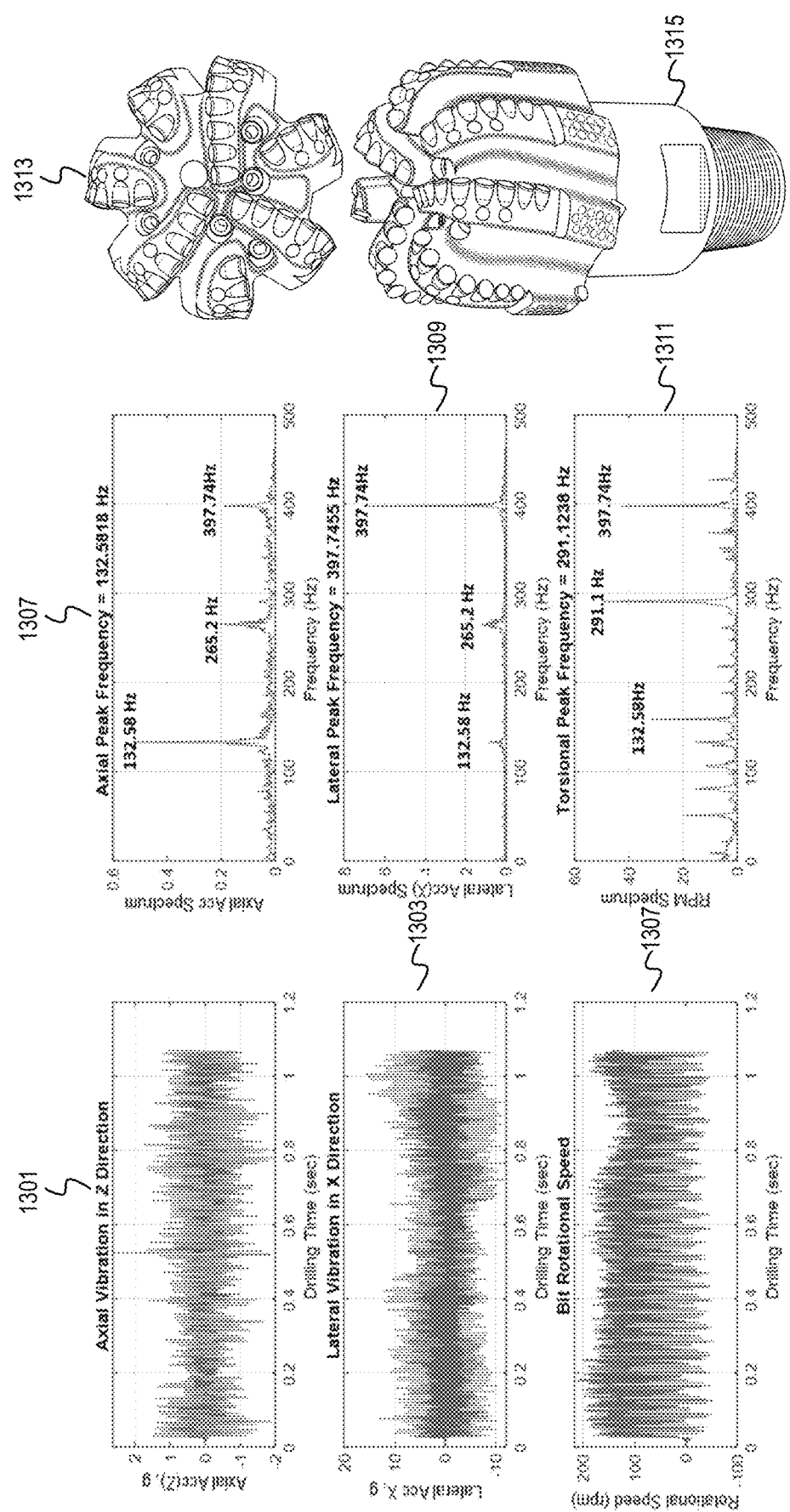
FIG. 13 depicts plots of vibrational data and vibrational frequency data for a 8½", 7 blade PDC drill bit experiencing 3D coupled vibration.

FIG. 13 depicts plots of vibrational data and vibrational frequency data for a 8½", 7 blade PDC drill bit experiencing 3D coupled vibration. Plots 1301, 1303, and 1305 display axial, lateral, and torsional vibration in g, g, and RPM respectively versus time in seconds. Plots 1307, 1309, and 1301 display plots of lateral, torsional, and frequency spectrum respectively versus frequency in Hz. All plots are for the PDC drill bit depicted with top view 1313 and side view 1315 having bit size 8½" with 7 blades in directional drilling with a push-the-bit rotary steerable system. 3D coupled vibration occurs at 397.74 Hz which dominates the lateral vibration. Axial and lateral vibrations are coupled at 132.58 Hz, 265.2 Hz, and 397.7 Hz. Conversely, the torsional vibrations exhibit peaks at 132.58 Hz and 291.1 Hz.

Figure 14:
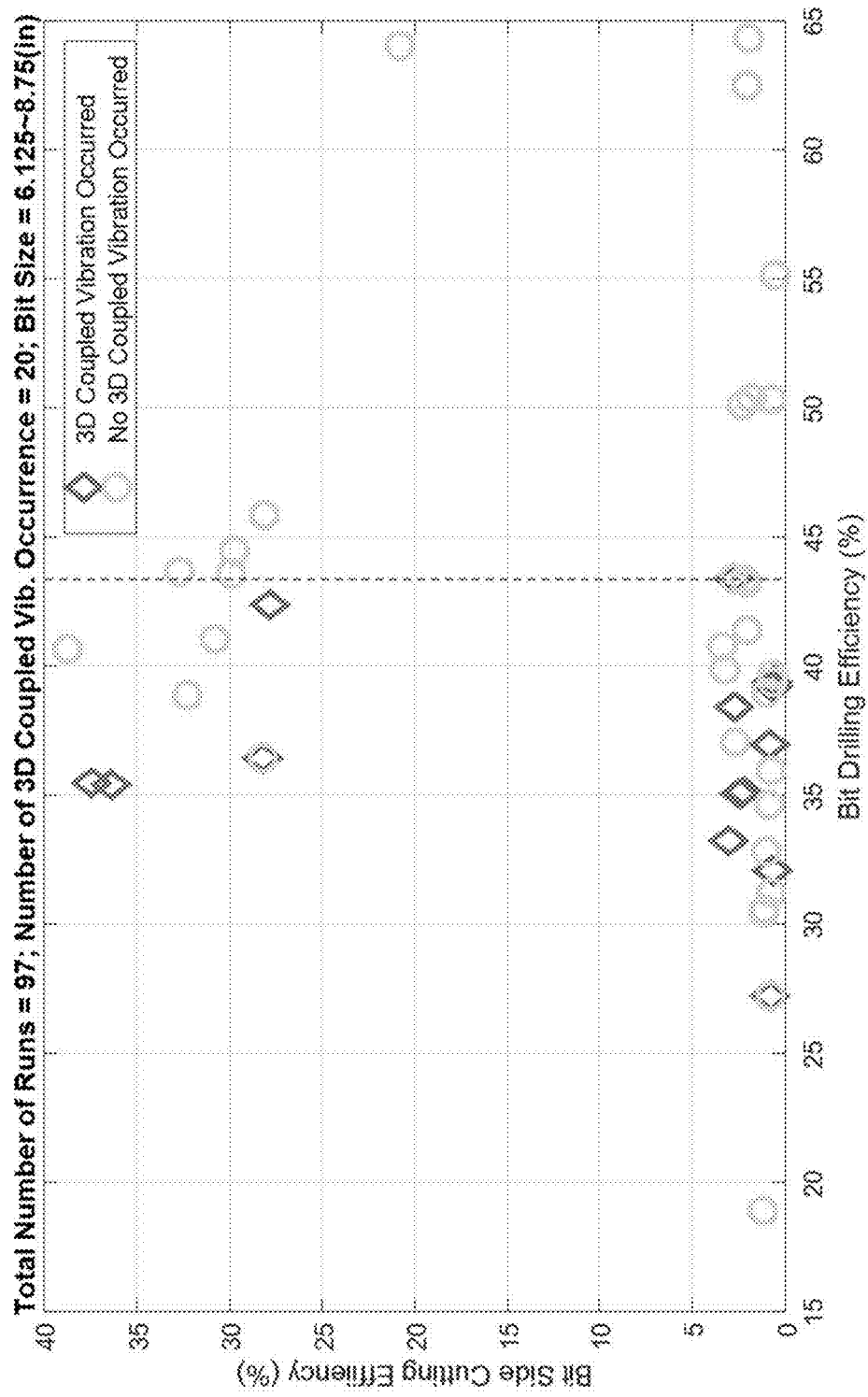
FIG. 14 depicts a plot of drilling efficiency (DE) in percent versus bit side cutting efficiency (SCE) in percent for non-directional PDC bits with bit size in the range 6.125 inches to 8.75 inches.

FIG. 14 depicts a plot of bit drilling efficiency (DE) in percent versus bit side cutting efficiency (SCE) in percent for non-directional PDC bits with bit size in the range 6.125 inches to 8.75 inches. In the plot 1400, 97 runs (i.e. 97 PDC bit deployments) were conducted with 20 occurrences of 3D coupled vibration. Several of the occurrences of both 3D coupled vibration and no 3D coupled vibration occurred with the same DE/SCE values and are represented as a single icon in FIG. 14. All instances of 3D coupled vibration occurred at DE<44%. Therefore, design considerations include a threshold DE>44%. Conversely, no correlation between SCE and 3D coupled vibration was detected and therefore this is not a factor in design considerations.

Figure 15:
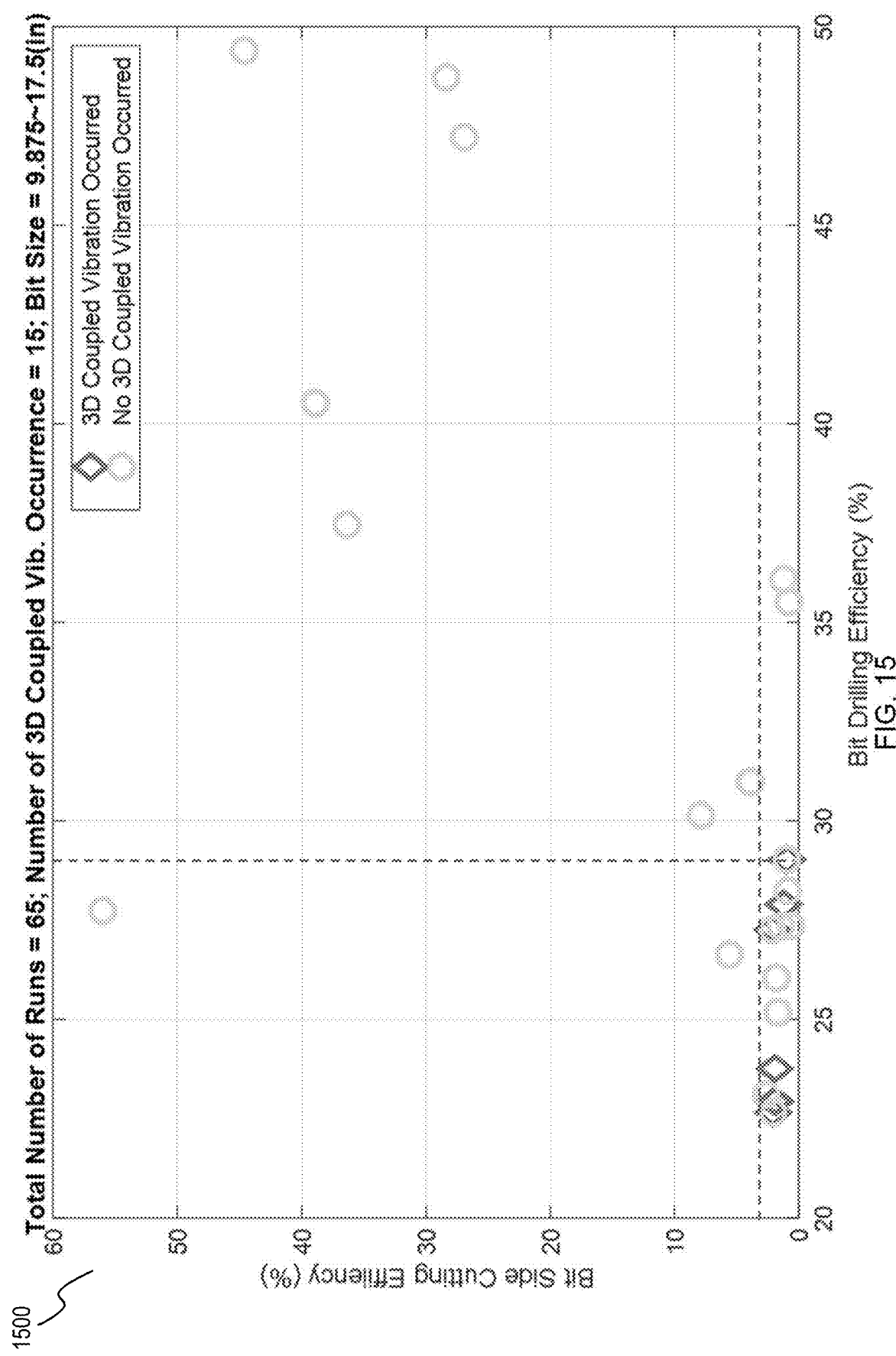
FIG. 15 depicts a plot of bit drilling efficiency (DE) in percent versus bit side cutting efficiency (SCE) in percent for non-directional PDC bits with bit size in the range 9.775 inches to 17.5 inches.

FIG. 15 depicts a plot of bit drilling efficiency (DE) in percent versus bit side cutting efficiency (SCE) in percent for non-directional PDC bits with bit size in the range 9.775 inches to 17.5 inches. In the plot 1500, 65 runs (i.e. 65 PDC bit deployments) were conducted with 15 occurrences of 3D coupled vibration. Several of the occurrences of both 3D coupled vibration and no 3D coupled vibration occurred with the same DE/SCE values and are represented as a single icon in FIG. 15. All instances of 3D coupled vibration occurred at DE<29% and SCE<5%. Therefore, design considerations include a threshold DE>30% and a threshold SCE>5% as depicted in the plot 1500.

Figure 16:
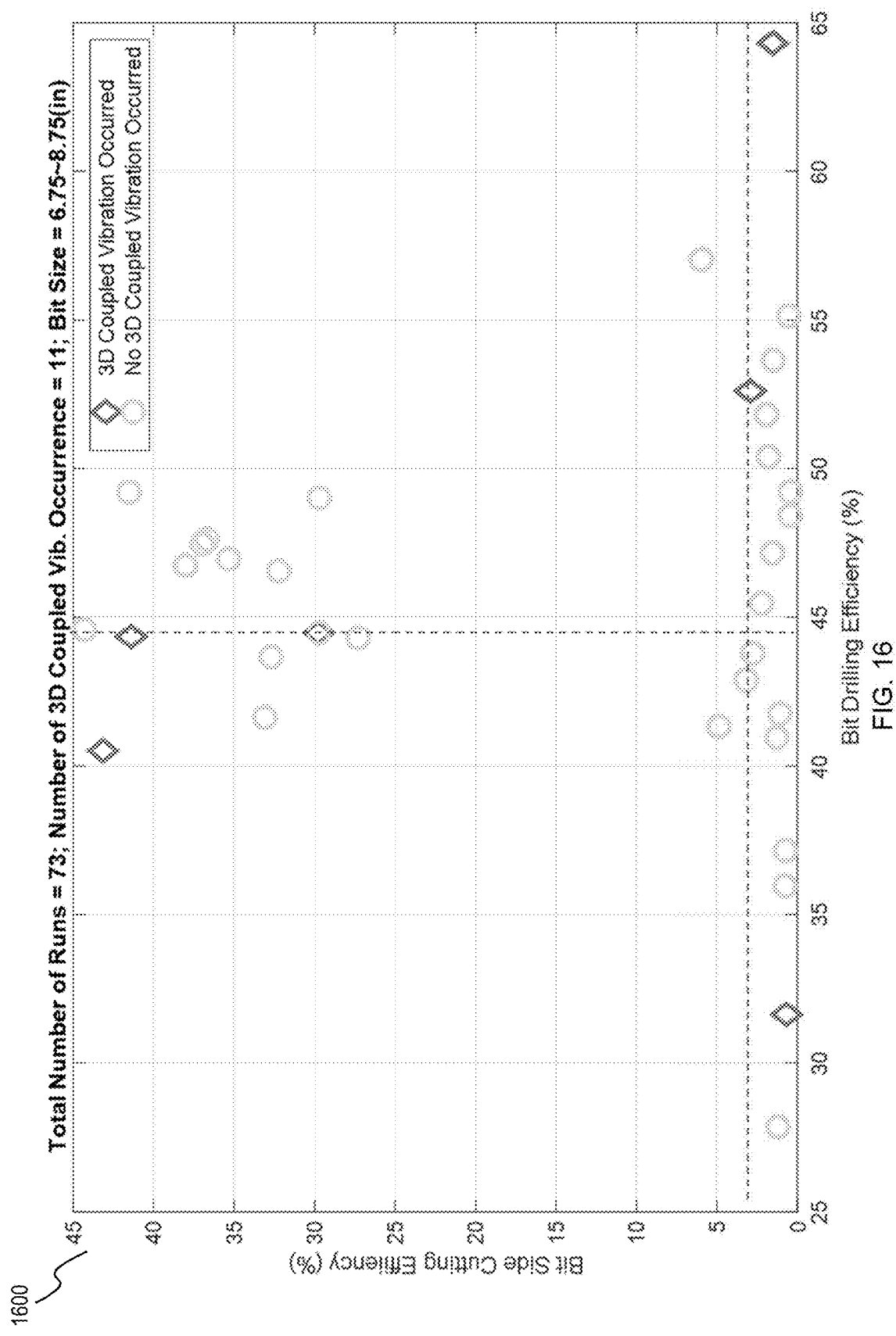
FIG. 16 depicts a plot of bit drilling efficiency (DE) in percent versus bit side cutting efficiency (SCE) in percent for directional bits with bit size between 6.75 inches and 8.75 inches.

FIG. 16 depicts a plot of bit drilling efficiency (DE) in percent versus bit side cutting efficiency (SCE) in percent for directional bits with bit size between 6.75 inches and 8.75 inches. In the plot 1600, 73 runs (i.e. 73 deployments of PDC bits) were conducted with 11 occurrences of 3D coupled vibration. Several of the occurrences of both 3D coupled vibration and no 3D coupled vibration occurred with the same DE/SCE values and are represented as a single icon in FIG. 16. All instances of 3D coupled vibration occurred at DE<45% and SCE<5%. Therefore, design considerations include a threshold DE>45% and a threshold SCE>5% as depicted in the plot 1600.

Figure 17:
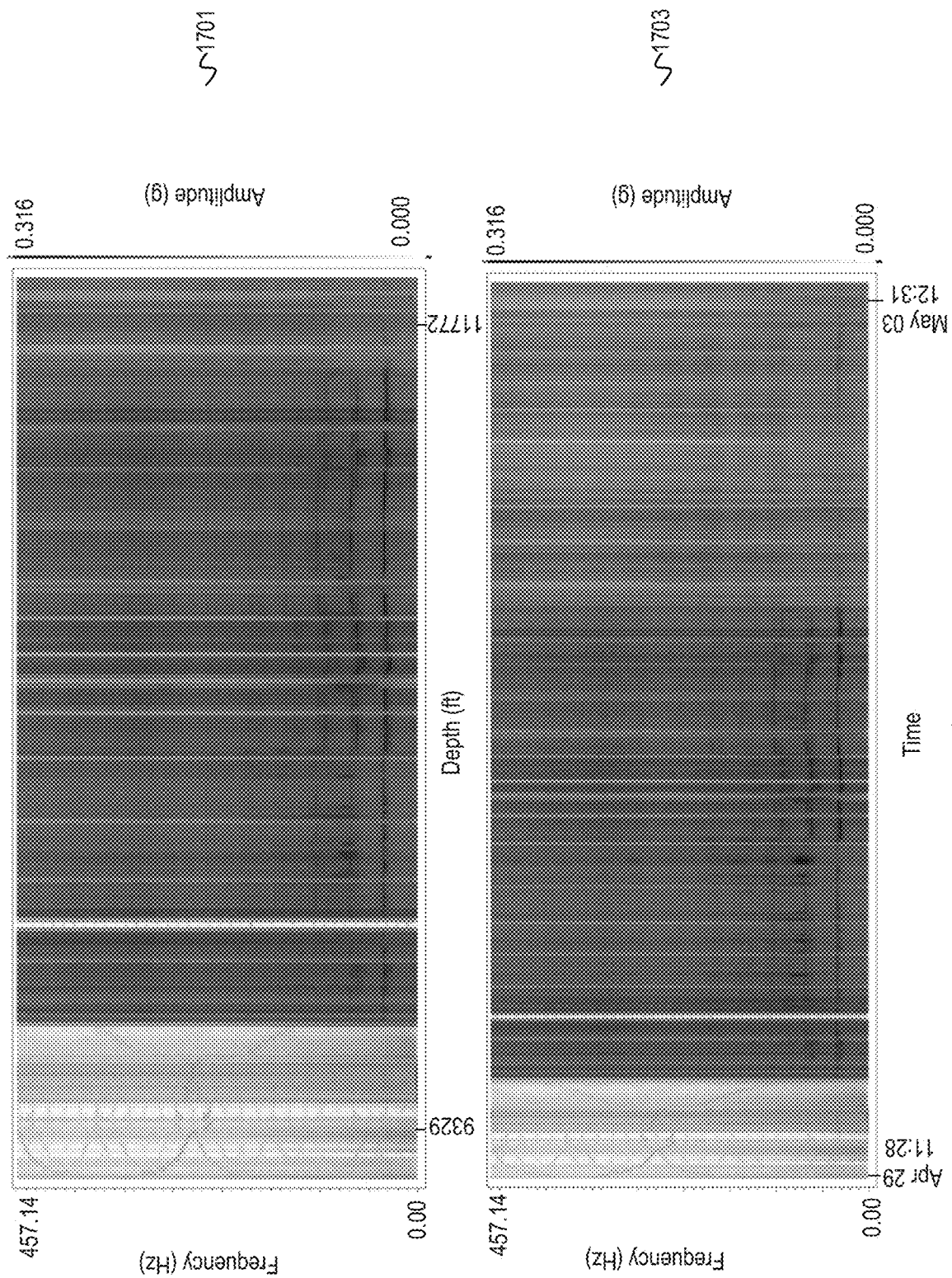
FIG. 17 depicts plots of spectrograms for vibrational drill bit data.

FIG. 17 depicts plots of spectrograms for vibrational drill bit data. Plot 1701 depicts a heat map of amplitude in g over a plot of frequency in Hz versus depth in feet. Frequency ranges from 0 Hz to 357.14 Hz, depth ranges in even intervals from around 9329 feet to 11772 feet, and amplitude ranges from 0 g to 0.316 g. Artifacts in the form of vertical light-colored stripes occur throughout the spectrogram representing the beginning of drilling operations at higher depths and the periodic pausing of drilling operations at lower depths. Interspersed with the vertical light-colored lines are dark horizontal bands representing high amplitude frequencies, possibly indicating 3D coupled vibration when correlated with frequency data for other directions. Plot 1703 depicts a heat map of amplitude in G over a plot of frequency in Hz versus depth in feet. Frequency ranges from 0 Hz to 357.14 Hz, time ranges in even intervals from around April 19$^{th}$, 11:28 to May 3, 12:31, and amplitude ranges from 0 g to 0.316 g. Similar light-colored vertical stripes occur to those present in plot 1701. Additionally, dark colored horizontal bands representing high amplitude frequencies can be compared to high amplitude frequencies in other directions to detect 3D coupled vibration.

Figure 18:
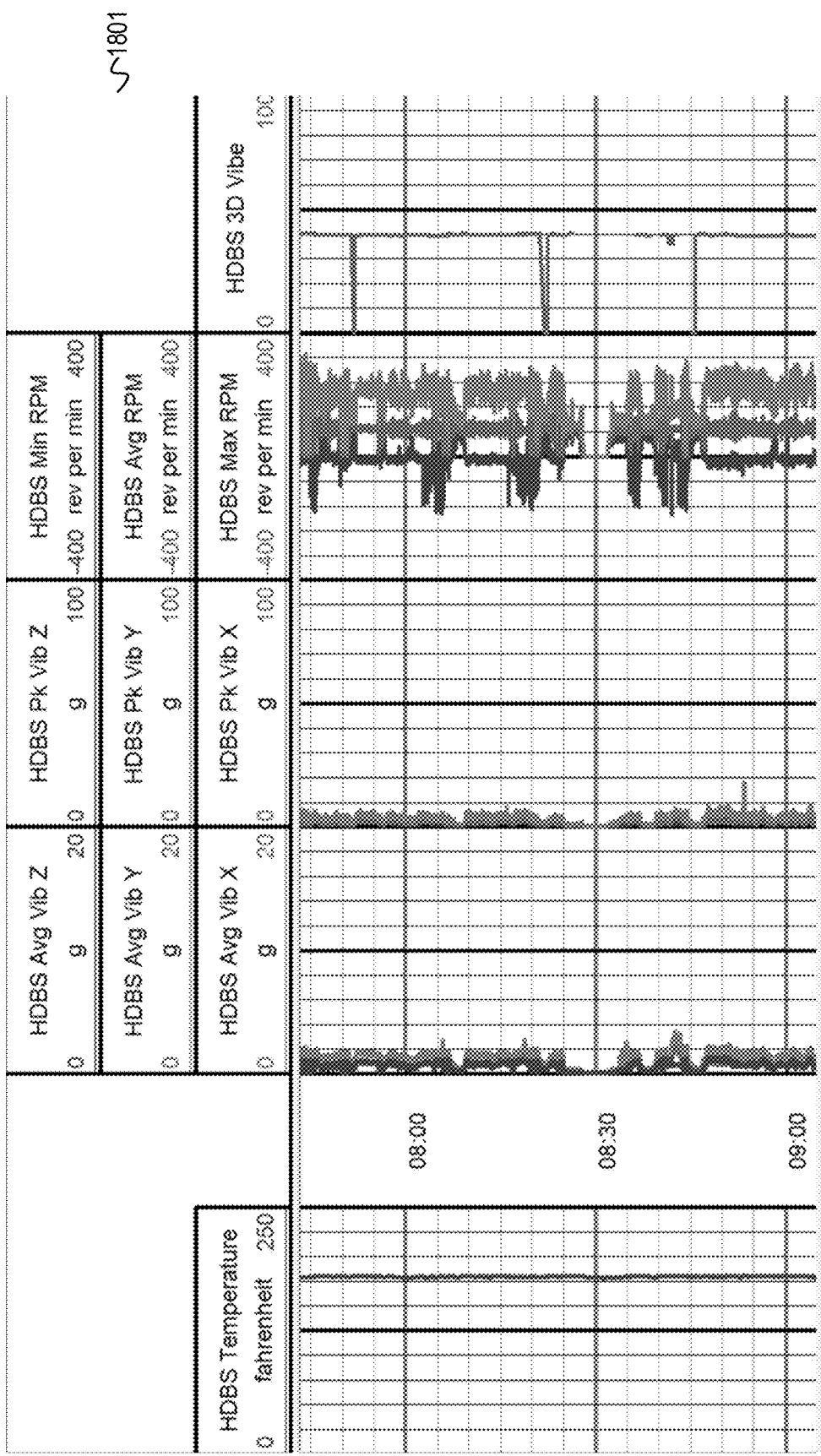
FIG. 18 depicts a plot of various drilling parameters versus time in a drilling operation.

FIG. 18 depicts a plot of various drilling parameters versus time in a drilling operation. A plot 1801 plots time on the Y axis between approximately 7:30 and 9:00 versus drilling parameters comprising temperature, average vibration in X, Y, and Z directions, peak vibration in X, Y, and Z directions, min RPM, average RPM, max RMP, and 3D coupled vibration. To the far right in plot 1801, temperature is plotted in Fahrenheit and remains close to 200° F. at all times. To the right of temperature is average vibration in g in each of the X, Y, and Z directions representing lateral, torsional, and axial vibrations, respectively. Average vibrations remain relatively uniform across all directions, with vibrations in the X and Y directions maintaining a consistent higher magnitude, and periodic lulls in amplitude corresponding to interruptions in drilling operations. To the right of average vibrations is peak vibrations in g in each of the X, Y, Z directions. The peak vibrations exhibit similar behavior to the average vibrations. To the right of peak vibrations are minimum, maximum, and average rotational speed in RPMs. Predictably, the minimum rotational speed is consistently lower than the average rotational speed, which is also consistently lower than the maximum rotational speed. Spikes in all of the rotational speeds occur prior to the peaks in 3D coupled vibration at around 7:45, 8:20, and 8:45.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine-readable medium(s) may be utilized. The machine-readable medium may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain or store a program for use by or in connection with an instruction execution system, apparatus, or device. A machine-readable storage medium is not a machine-readable signal medium.

A machine-readable signal medium may include a propagated data signal with machine-readable program code embodied therein, for example, in baseband or as part of a carrier wave. Such a propagated signal may take any of a variety of forms, including, but not limited to, electro-magnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

The program code/instructions may also be stored in a machine-readable medium that can direct a machine to function in a particular manner, such that the instructions stored in the machine-readable medium produce an article of manufacture including instructions which implement the function/act specified in the flowchart and/or block diagram block or blocks.

While the aspects of the disclosure are described with reference to various implementations and exploitations, it will be understood that these aspects are illustrative and that the scope of the claims is not limited to them. In general, techniques for detecting 3D coupled vibration using common peaks in frequency vibrational data across lateral, axial, and torsional directions in a drill bit, visualizing the 3D coupled vibration, and correlating drilling efficiency and side cutting efficiency to inform drill bit design as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

As used herein, the term "or" is inclusive unless otherwise explicitly noted. Thus, the phrase "at least one of A, B, or C" is satisfied by any element from the set {A, B, C} or any combination thereof, including multiples of any element.

Example Embodiments

Embodiment 1: a method comprising simulating a first plurality of drill bit designs to generate simulated drill bit data, calculating, from the simulated drill bit data, drill bit metric values for the first plurality of drill bit designs, determining correlations between the drill bit metric values and a presence of 3D coupled vibration for the first plurality of drill bit designs as indicated in the simulated drill bit data, and generating a second plurality of drill bit designs with reduced 3D coupled vibration based, at least in part, on the first plurality of drill bit designs and the determined correlations.

Embodiment 2: the method of Embodiment 1, wherein generating the second plurality of drill bit designs comprises, determining a threshold metric value for drill bit metric values corresponding to a first drill bit metric that is correlated with 3D coupled vibration for the first plurality of drill bit designs, and updating drill bit design parameters for a drill bit design in the first plurality of drill bit designs based, at least in part, on the threshold metric value.

Embodiment 3: the method of Embodiment 2, further comprising removing a first drill bit design in the first plurality of drill bit designs having a first metric value associated with the first drill bit metric below the threshold metric value, and generating a second drill bit design based, at least in part, on the threshold metric value, wherein the second plurality of drill bit designs includes the second drill bit design.

Embodiment 4: the method of Embodiment 2, further comprising relaxing the threshold metric value for evaluation of the second plurality of drill bit designs.

Embodiment 5: the method of any of Embodiments 1-4, wherein the drill bit metric values correspond to values for at least one of drilling efficiency and side cutting efficiency.

Embodiment 6: the method of any of Embodiments 1-5, further comprising determining the presence of 3D coupled vibration in the simulated drill bit data.

Embodiment 7: the method of Embodiment 6, wherein determining the presence of 3D coupled vibration in the simulated drill bit data comprises identifying a first frequency corresponding to a peak in frequency vibrational data for lateral, axial, and torsional directions relative to a drill bit.

Embodiment 8: the method of any of Embodiments 1-7, wherein calculating the drill bit metric values for the first plurality of drill bit designs comprises calculating a value for at least a second drill bit metric for each of the first plurality of drill bit designs.

Embodiment 9: the method of any of Embodiments 1-8, wherein determining a correlation between drill bit metric values and the presence of 3D coupled vibration comprises determining that error for a regression with drill bit metric values for a third drill bit metric as an explanatory variable and the presence of 3D coupled vibration as a response variable is below a threshold error.

Embodiment 10: a non-transitory, computer-readable medium having instructions stored thereon that are executable by a computing device to perform operations comprising simulating a first plurality of drill bit designs to generate simulated drill bit data, calculating, from the simulated drill bit data, drill bit metric values for the first plurality of drill bit designs, determining correlations between the drill bit metric values and a presence of 3D coupled vibration for the first plurality of drill bit designs as indicated in the simulated drill bit data, and generating a second plurality of drill bit designs with reduced 3D coupled vibration based, at least in part, on the first plurality of drill bit designs and the determined correlations.

Embodiment 11: the computer-readable medium of Embodiment 10, wherein the instructions executable by the computing device to generate the second plurality of drill bit designs comprise instructions to determine a threshold metric value for drill bit metric values corresponding to a first drill bit metric that is correlated with 3D coupled vibration for the first plurality of drill bit designs, and update drill bit design parameters for a drill bit design in the first plurality of drill bit designs based, at least in part, on the threshold metric value.

Embodiment 12: the computer-readable medium of Embodiment 11, further comprising instructions executable by the computing device to remove a first drill bit design in the first plurality of drill bit designs having a first metric value associated with the first drill bit metric below the threshold metric value, and generate a second drill bit design based, at least in part, on the threshold metric value, wherein the second plurality of drill bit designs includes the second drill bit design.

Embodiment 13: the computer-readable medium of Embodiment 11, further comprising instructions executable by the computing device to relax the threshold metric value for evaluation of the second plurality of drill bit designs.

Embodiment 14: the computer-readable medium of any of Embodiments 10-13, wherein the drill bit metric values correspond to values for at least one of drilling efficiency and side cutting efficiency.

Embodiment 15: an apparatus comprising a processor, and a computer-readable medium having instructions stored thereon that are executable by the processor to cause the apparatus to simulate a first plurality of drill bit designs to generate simulated drill bit data, calculate, from the simulated drill bit data, drill bit metric values for the first plurality of drill bit designs, determine correlations between the drill bit metric values and a presence of 3D coupled vibration for the first plurality of drill bit designs as indicated in the simulated drill bit data, and generate a second plurality of drill bit designs with reduced 3D coupled vibration based, at least in part, on the first plurality of drill bit designs and the determined correlations.

Embodiment 16: the apparatus of Embodiment 15, wherein the instructions executable by the processor to cause the apparatus to generate the second plurality of drill bit designs comprise instructions to determine a threshold metric value for drill bit metric values corresponding to a first drill bit metric that is correlated with 3D coupled vibration for the first plurality of drill bit designs, and update drill bit design parameters for a drill bit design in the first plurality of drill bit designs based, at least in part, on the threshold metric value.

Embodiment 17: the apparatus of Embodiment 16, further comprising instructions executable by the processor to cause the apparatus to remove a first drill bit design in the first plurality of drill bit designs having a first metric value associated with the first drill bit metric below the threshold metric value, and generate a second drill bit design based, at least in part, on the threshold metric value, wherein the second plurality of drill bit designs includes the second drill bit design.

Embodiment 18: the apparatus of Embodiment 16, further comprising instructions executable by the processor to cause the apparatus to relax the threshold metric value for evaluation of the second plurality of drill bit designs.

Embodiment 19: the apparatus of any of Embodiments 15-18, wherein the drill bit metric values correspond to values for at least one of drilling efficiency and side cutting efficiency.

Embodiment 20: the apparatus of any of Embodiments 15-19, further comprising instructions executable by the processor to cause the apparatus to determine the presence of 3D coupled vibration in the simulated drill bit data.

The invention claimed is:

1. A method comprising:
   simulating a first plurality of drill bit designs to generate simulated drill bit data;
   calculating, from the simulated drill bit data, drill bit metric values for the first plurality of drill bit designs;
   determining correlations between the drill bit metric values and a presence of 3D coupled vibration for the first plurality of drill bit designs as indicated in the simulated drill bit data, wherein 3D coupled vibration occurs when there are common peak values in frequency vibrational data across lateral, axial, and torsional directions, wherein the common peak values in frequency occur at a frequency higher than 5 Hz; and
   generating a second plurality of drill bit designs with reduced 3D coupled vibration based, at least in part, on the first plurality of drill bit designs and the determined correlations.

2. The method of claim 1, wherein generating the second plurality of drill bit designs comprises,
   determining a threshold metric value for drill bit metric values corresponding to a first drill bit metric that is correlated with 3D coupled vibration for the first plurality of drill bit designs; and
   updating drill bit design parameters for a drill bit design in the first plurality of drill bit designs based, at least in part, on the threshold metric value.

3. The method of claim 2, further comprising,
   removing a first drill bit design in the first plurality of drill bit designs having a first metric value associated with the first drill bit metric below the threshold metric value; and
   generating a second drill bit design based, at least in part, on the threshold metric value, wherein the second plurality of drill bit designs includes the second drill bit design.

4. The method of claim 2, further comprising relaxing the threshold metric value for evaluation of the second plurality of drill bit designs.

5. The method of claim 1, wherein the drill bit metric values correspond to values for at least one of drilling efficiency and side cutting efficiency.

6. The method of claim 1, wherein a drill bit analyzer determines the presence of 3D coupled vibration with a corresponding window of depth/time and frequency.

7. The method of claim 1, wherein calculating the drill bit metric values for the first plurality of drill bit designs comprises calculating a value for at least a second drill bit metric for each of the first plurality of drill bit designs.

8. The method of claim 1, wherein determining a correlation between drill bit metric values and the presence of 3D coupled vibration comprises determining that error for a regression with drill bit metric values for a third drill bit metric as an explanatory variable and the presence of 3D coupled vibration as a response variable is below a threshold error.

9. A non-transitory, computer-readable medium having instructions stored thereon that are executable by a computing device to perform operations comprising:
   simulating a first plurality of drill bit designs to generate simulated drill bit data;
   calculating, from the simulated drill bit data, drill bit metric values for the first plurality of drill bit designs;
   determining correlations between the drill bit metric values and a presence of 3D coupled vibration for the first plurality of drill bit designs as indicated in the simulated drill bit data, wherein 3D coupled vibration occurs when there are common peak values in frequency vibrational data across lateral, axial, and torsional directions, wherein the common peak values in frequency occur at a frequency higher than 5 Hz; and
   generating a second plurality of drill bit designs with reduced 3D coupled vibration based, at least in part, on the first plurality of drill bit designs and the determined correlations.

10. The computer-readable medium of claim 9, wherein the instructions executable by the computing device to generate the second plurality of drill bit designs comprise instructions to,
    determine a threshold metric value for drill bit metric values corresponding to a first drill bit metric that is correlated with 3D coupled vibration for the first plurality of drill bit designs; and
    update drill bit design parameters for a drill bit design in the first plurality of drill bit designs based, at least in part, on the threshold metric value.

11. The computer-readable medium of claim 10, further comprising instructions executable by the computing device to,
    remove a first drill bit design in the first plurality of drill bit designs having a first metric value associated with the first drill bit metric below the threshold metric value; and
    generate a second drill bit design based, at least in part, on the threshold metric value, wherein the second plurality of drill bit designs includes the second drill bit design.

12. The computer-readable medium of claim 10, further comprising instructions executable by the computing device to relax the threshold metric value for evaluation of the second plurality of drill bit designs.

13. The computer-readable medium of claim 9, wherein the drill bit metric values correspond to values for at least one of drilling efficiency and side cutting efficiency.

14. An apparatus comprising:
    a processor; and
    a computer-readable medium having instructions stored thereon that are executable by the processor to cause the apparatus to,
    simulate a first plurality of drill bit designs to generate simulated drill bit data;
    calculate, from the simulated drill bit data, drill bit metric values for the first plurality of drill bit designs;
    determine correlations between the drill bit metric values and a presence of 3D coupled vibration for the first plurality of drill bit designs as indicated in the simulated drill bit data, wherein 3D coupled vibration occurs when there are common peak values in frequency vibrational data across lateral, axial, and torsional directions, wherein the common peak values in frequency occur at a frequency higher than 5 Hz; and
    generate a second plurality of drill bit designs with reduced 3D coupled vibration based, at least in part, on the first plurality of drill bit designs and the determined correlations.

15. The apparatus of claim 14, wherein the instructions executable by the processor to cause the apparatus to generate the second plurality of drill bit designs comprise instructions to,
    determine a threshold metric value for drill bit metric values corresponding to a first drill bit metric that is correlated with 3D coupled vibration for the first plurality of drill bit designs; and update drill bit design parameters for a drill bit design in the first plurality of drill bit designs based, at least in part, on the threshold metric value.

16. The apparatus of claim 15, further comprising instructions executable by the processor to cause the apparatus to,
remove a first drill bit design in the first plurality of drill bit designs having a first metric value associated with the first drill bit metric below the threshold metric value; and
generate a second drill bit design based, at least in part, on the threshold metric value, wherein the second plurality of drill bit designs includes the second drill bit design.

17. The apparatus of claim 15, further comprising instructions executable by the processor to cause the apparatus to relax the threshold metric value for evaluation of the second plurality of drill bit designs.

18. The apparatus of claim 14, wherein the drill bit metric values correspond to values for at least one of drilling efficiency and side cutting efficiency.

\* \* \* \* \*